US012020935B2

(12) United States Patent
Nishi et al.

(10) Patent No.: US 12,020,935 B2
(45) Date of Patent: Jun. 25, 2024

(54) METHOD OF MANUFACTURING SEMICONDUCTOR DEVICE

(71) Applicant: Mitsubishi Electric Corporation, Tokyo (JP)

(72) Inventors: Koichi Nishi, Tokyo (JP); Shinya Soneda, Tokyo (JP); Kazuya Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 363 days.

(21) Appl. No.: 17/563,603

(22) Filed: Dec. 28, 2021

(65) Prior Publication Data

US 2022/0310396 A1 Sep. 29, 2022

(30) Foreign Application Priority Data

Mar. 25, 2021 (JP) .................................. 2021-051085

(51) Int. Cl.
*H01L 21/266* (2006.01)
*H01L 21/22* (2006.01)
*H01L 21/768* (2006.01)

(52) U.S. Cl.
CPC ........ *H01L 21/266* (2013.01); *H01L 21/2225* (2013.01); *H01L 21/76831* (2013.01)

(58) Field of Classification Search
CPC ............... H01L 21/266; H01L 21/2225; H01L 21/76831; H01L 29/1095; H01L 29/0696;
(Continued)

(56) References Cited

U.S. PATENT DOCUMENTS

2006/0049459 A1* 3/2006 Aida ................. H01L 29/66712
257/341
2012/0058617 A1* 3/2012 Watanabe ........... H01L 29/7802
257/E21.409
(Continued)

FOREIGN PATENT DOCUMENTS

JP 2015-170837 A 9/2015
JP 2016-046445 A 4/2016
(Continued)

OTHER PUBLICATIONS

An Office Action; "Notice of Reasons for Refusal," mailed by the Japanese Patent Office on Jan. 30, 2024, which corresponds to Japanese Patent Application No. 2021-051085 and is related to U.S. Appl. No. 17/563,603; with English language translation.

*Primary Examiner* — Yasser A Abdelaziez
(74) *Attorney, Agent, or Firm* — Studebaker & Brackett PC

(57) ABSTRACT

An object of the present disclosure is to reduce masks and to reduce the variation in the profile of an impurity layer in a semiconductor device. A method of manufacturing a semiconductor device includes a step (b) of forming a base layer on a first main surface side of a drift layer in an active region by implanting p-type impurity ions of using the first mask, a step of (c) of forming an emitter layer on the first main surface side of the base layer by implanting n-type impurity ions using the first mask, a step (d) of forming trenches after the steps (b) and (c), a step (e) of embedding a gate electrode inside the trenches, and a step (g) of converting a part of the emitter layer into a first contact layer by implanting the p-type impurity ions having a high dosage using a second mask.

8 Claims, 20 Drawing Sheets

(58) Field of Classification Search
CPC ............. H01L 29/407; H01L 29/66348; H01L 29/7397; H01L 21/2253; H01L 29/401; H01L 29/66666
See application file for complete search history.

(56) References Cited

U.S. PATENT DOCUMENTS

2016/0099316 A1* 4/2016 Arai .................... H01L 29/7813
257/77
2016/0322227 A1 11/2016 Arai et al.
2018/0047821 A1* 2/2018 Iwasaki ............. H01L 29/42376
2019/0237545 A1* 8/2019 Suzuki .............. H01L 29/66333
2021/0273083 A1 9/2021 Yamashiro et al.

FOREIGN PATENT DOCUMENTS

| JP | 2016-076553 A | 5/2016 |
| JP | 2019-134069 A | 8/2019 |
| WO | 2020/026401 A1 | 2/2020 |

* cited by examiner

F I G. 5
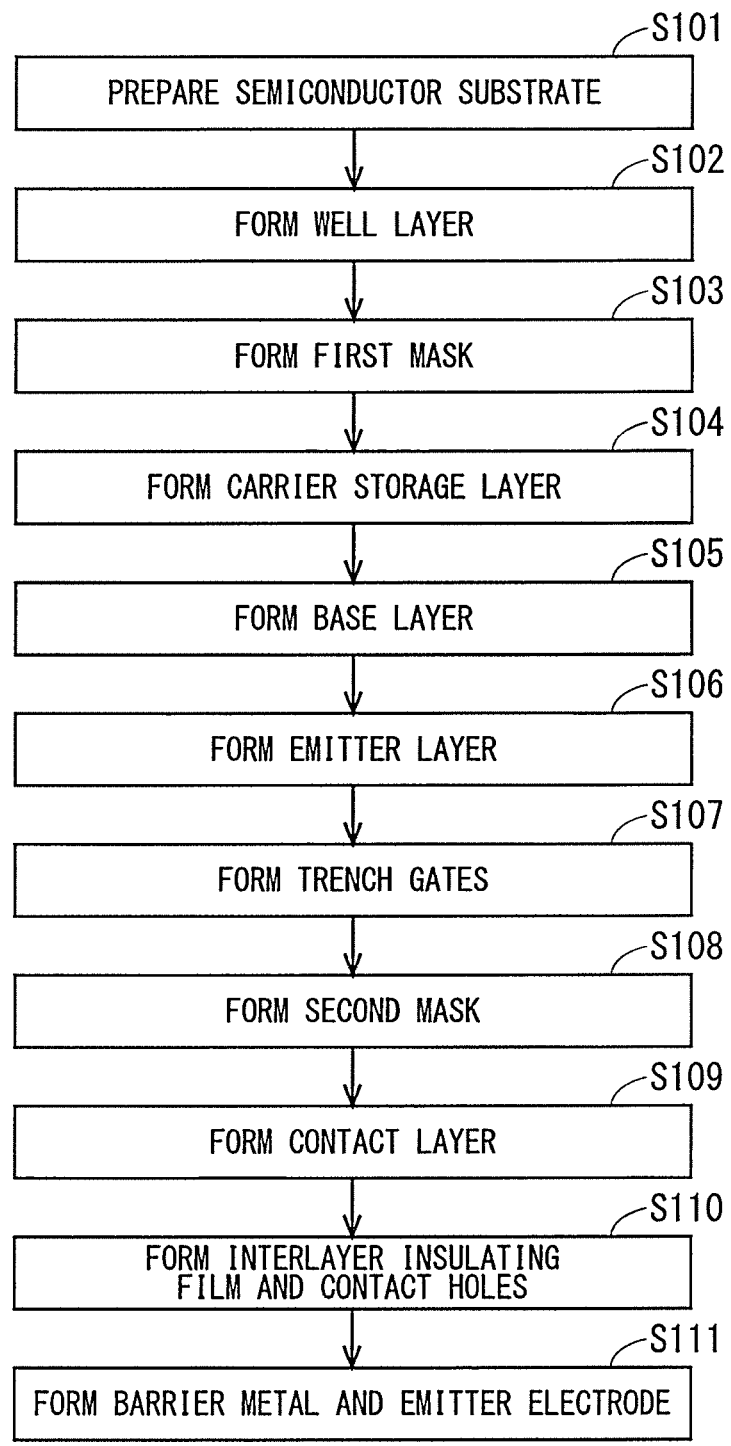

F I G. 9
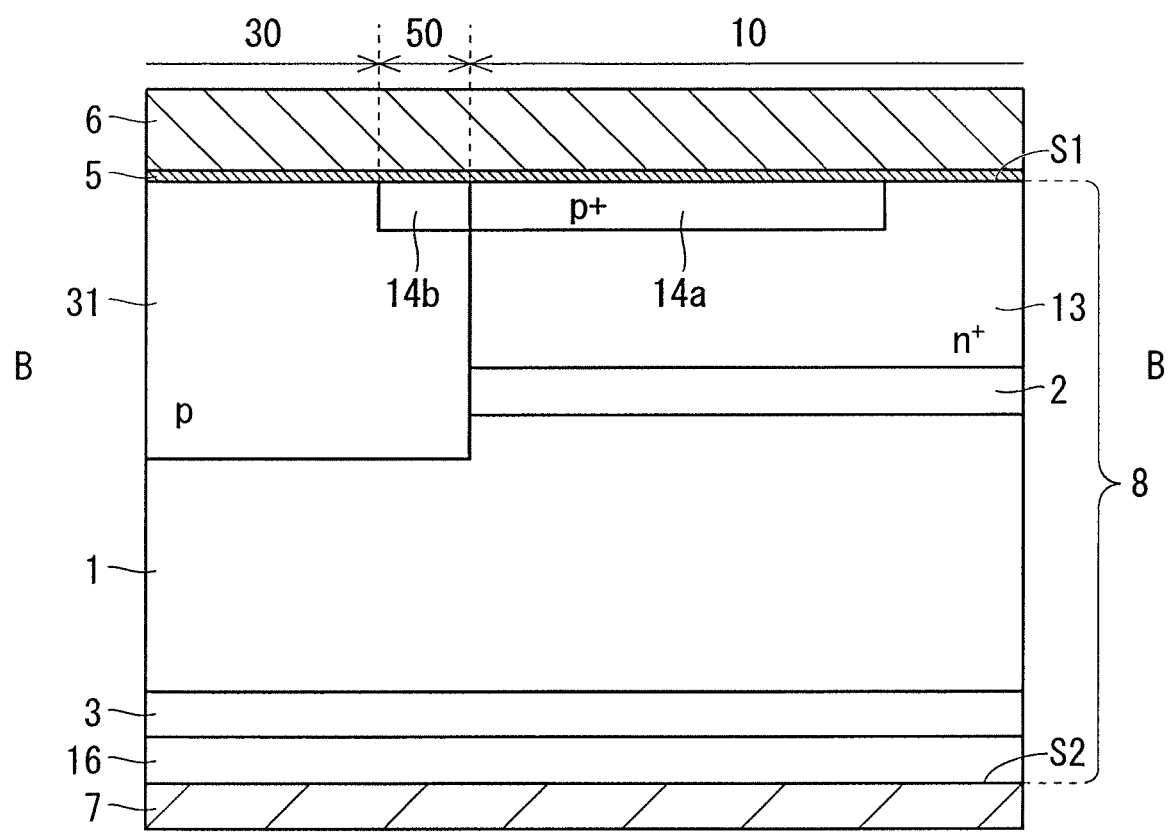

F I G. 1 0
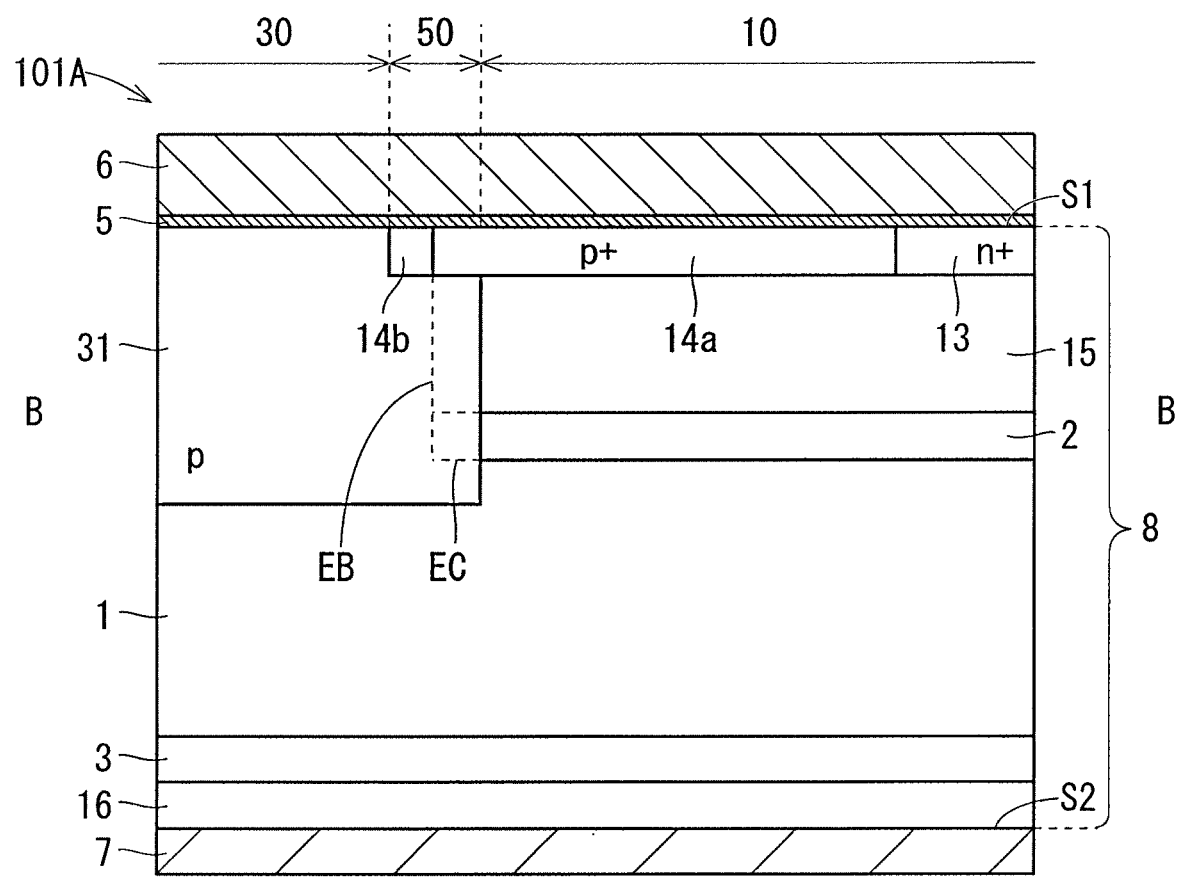

F I G. 1 6
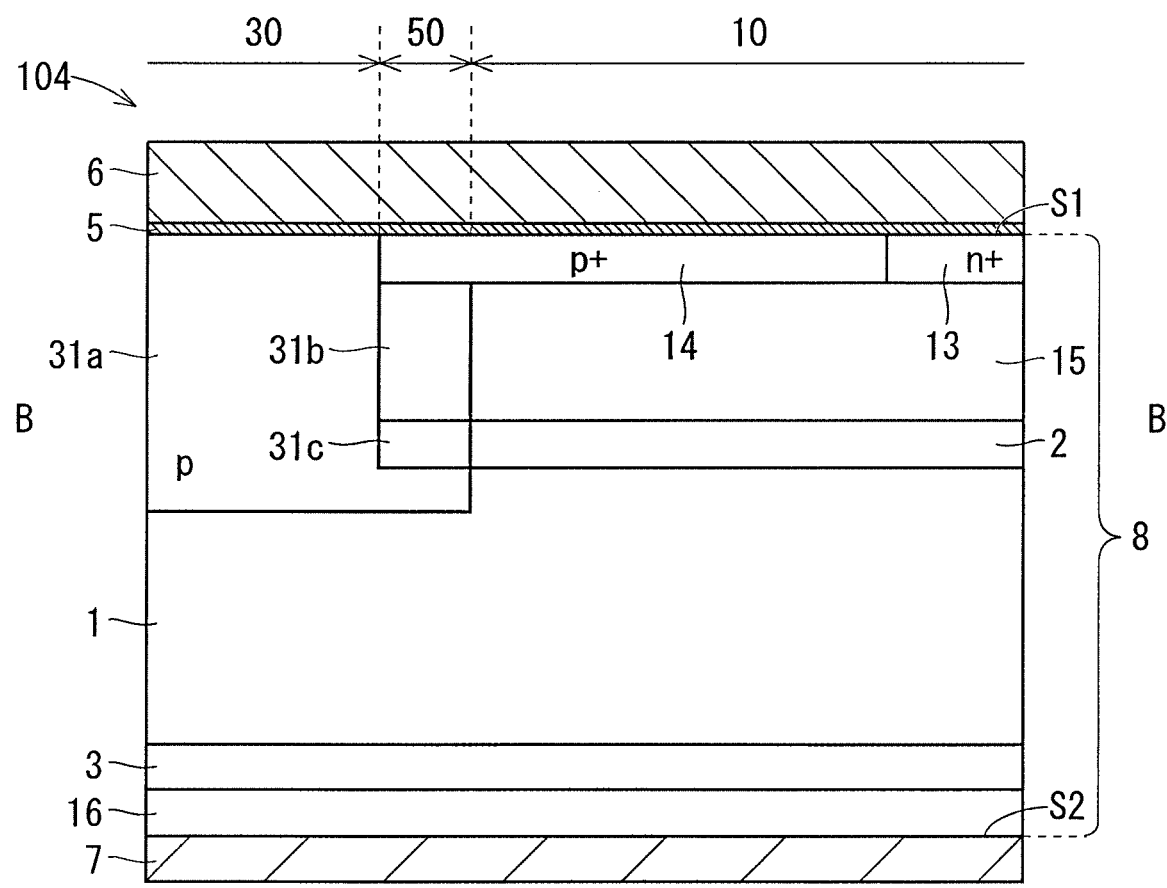

F I G. 1 7
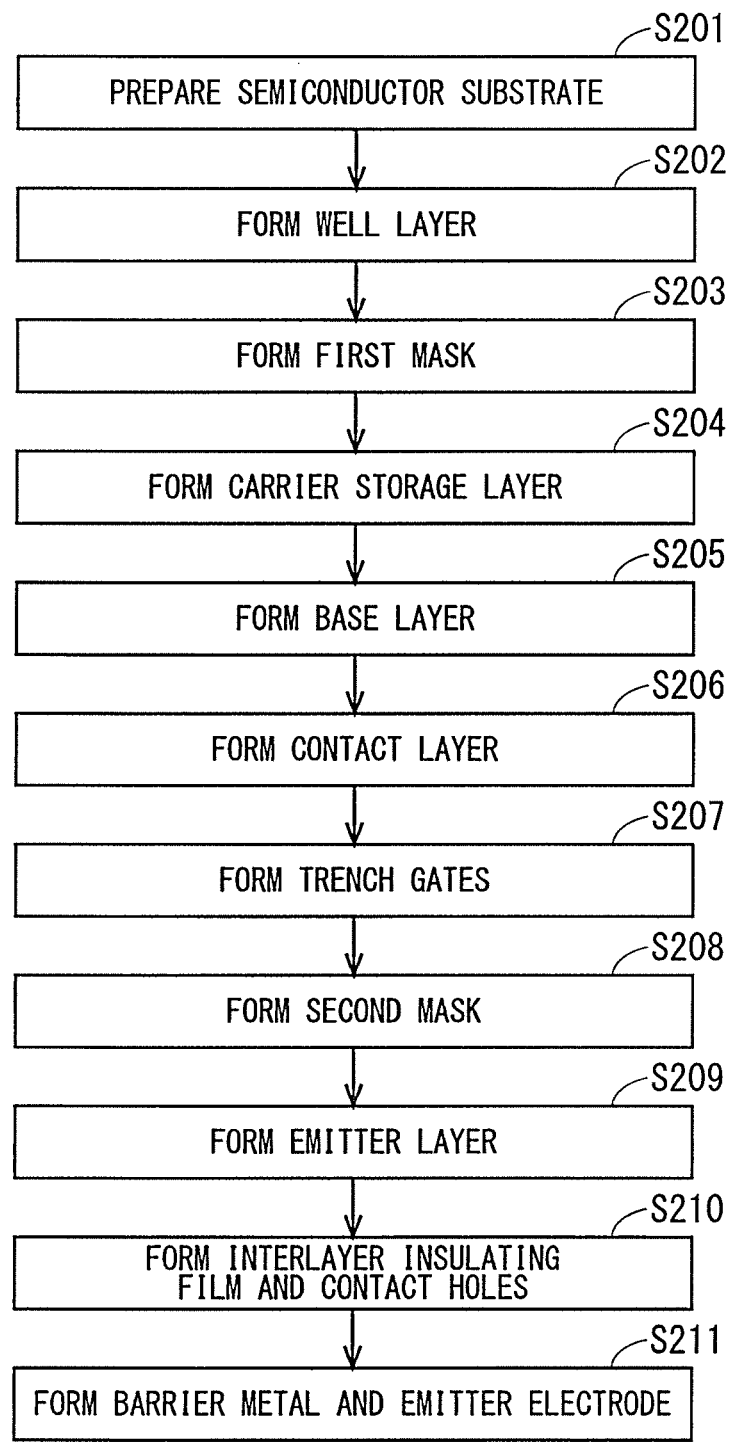

METHOD OF MANUFACTURING SEMICONDUCTOR DEVICE

BACKGROUND OF THE INVENTION

Field of the Invention

The present disclosure relates to a method of manufacturing a semiconductor device.

Description of the Background Art

From the viewpoint of energy saving, IGBTs or diodes are used in power modules and the like for variable speed control of three-phase motors in the fields of general-purpose inverters and AC servo motors. In order to reduce inverter loss, IGBTs or diodes are required to have devices with low switching loss and low on-voltage.

As a device having a low switching loss, a trench gate type IGBT represents thereof. An N-channel trench gate type IGBT has three impurity layers: a P-type base layer, an N-type emitter layer, and a P-type contact layer. There has been a problem of high manufacturing cost due to the three impurity layers because different masks are used for forming the three respective layers. The problem occurs not only in a trench gate type IGBT but also in other semiconductor devices having a trench type MOS gate structure.

In terms of this problem, Japanese Patent Application Laid-Open No. 2016-046445 proposes a method of forming an N-type emitter layer by reversing the P-type contact layer with N-type impurity ions using oblique implantation after forming trench gates (Paragraph 0064).

SUMMARY

According to the manufacturing method proposed in Japanese Patent Application Laid-Open No. 2016-046445, there has been a problem in that, the impurity layer is formed by oblique implantation after the trench gates are formed; therefore, the profile of the impurity layer varies due to the influence of steps on the surface of the semiconductor substrate.

An object of the technology of the present disclosure is to reduce the number of masks for forming an impurity layer and to reduce the variation in the profile of the impurity layer in a semiconductor device having a trench-type MOS gate structure.

A method of manufacturing a first semiconductor device of the present disclosure is a method of manufacturing a semiconductor device demarcated into an active region, a boundary region surrounding the active region, and an edge region surrounding the boundary region in plan view. The method of manufacturing the first semiconductor device includes steps (a), (b), (c), (d), (e), (f), and (g). The step (a) is a step of forming a first mask on the first main surface of the semiconductor substrate having a drift layer of a first conductivity type. The step (b) is a step of forming a base layer of a second conductivity type on the first main surface side of at least a part a region of the drift layer in the active region by implanting impurity ions of the second conductivity type into the first main surface of the semiconductor substrate using the first mask. The step (c) is a step of forming an impurity layer of the first conductivity type on the first main surface side of the base layer by implanting impurity ions of the first conductivity type into the first main surface of the semiconductor substrate using the first mask. The step (d) is a step of forming trenches reaching the drift layer from the first main surface of the semiconductor substrate after the steps (b) and (c). The step (e) is a step of embedding a gate electrode inside the trenches via a gate insulating film. The step (f) is a step of forming a second mask having a different pattern from that of the first mask on the first main surface of the semiconductor substrate. The step (g) is a step of converting a part of the impurity layer into a first contact layer of the second conductivity type by implanting impurity ions of the second conductivity type having a dosage higher than that of the impurity ions of the first conductivity type implanted at the step (c) into the first main surface of the semiconductor substrate using the second mask.

According to the method of manufacturing the first semiconductor device, the number of masks for forming an impurity layer can be reduced. Further, according to the method of manufacturing of present disclosure, the variation in the impurity profile caused by the steps on the surface of the semiconductor substrate is suppressed because the ion implantation into the flat first main surface of the semiconductor substrate is performed to form the base layer and the impurity layer, before forming the trench gates.

A method of manufacturing a second semiconductor device of the present disclosure is a method of manufacturing a semiconductor device demarcated into an active region, a boundary region surrounding the active region, and an edge region surrounding the boundary region in plan view. The method of manufacturing the second semiconductor device includes steps (a), (b), (c), (d), (e), (f), and (g). The step (a) is a step of forming a first mask on the first main surface of the semiconductor substrate having a drift layer of a first conductivity type. The step (b) is a step of forming a base layer of a second conductivity type on the first main surface side of the drift layer in the active region by implanting impurity ions of the second conductivity type into the first main surface of the semiconductor substrate using the first mask. The step (c) is a step of forming a contact layer of the second conductivity type on the first main surface side of the base layer by implanting impurity ions of the second conductivity type into the first main surface of the semiconductor substrate using the first mask. The step (d) is a step of forming trenches reaching the drift layer from the first main surface of the semiconductor substrate after the steps (b) and (c). The step (e) is a step of embedding a gate electrode inside the trenches via a gate insulating film. The step (f) is a step of forming a second mask having a different pattern from that of the first mask on the first main surface of the semiconductor substrate. The step (g) is a step of converting a part of the contact layer into an impurity layer of the first conductivity type by implanting impurity ions of the first conductivity type having a dosage higher than that of the impurity ions of the second conductivity type implanted at the step (c) into the first main surface of the semiconductor substrate using the second mask.

According to the method of manufacturing the second semiconductor device, the number of masks for forming an impurity layer can be reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a flowchart illustrating a manufacturing process of the IGBT of Embodiment 1;

FIG. 9 is a cross-sectional view of an IGBT of a comparative example;

FIG. 10 is a cross-sectional view of an IGBT of Modification of Embodiment 1 along the line B-B of FIG. 2;

FIG. 16 is a cross-sectional view of the IGBT of Embodiment 4 along the line B-B of FIG. 2;

FIG. 17 is a flowchart illustrating a manufacturing process of the IGBT of Embodiment 4;

DESCRIPTION OF THE PREFERRED EMBODIMENTS

Figure 1:
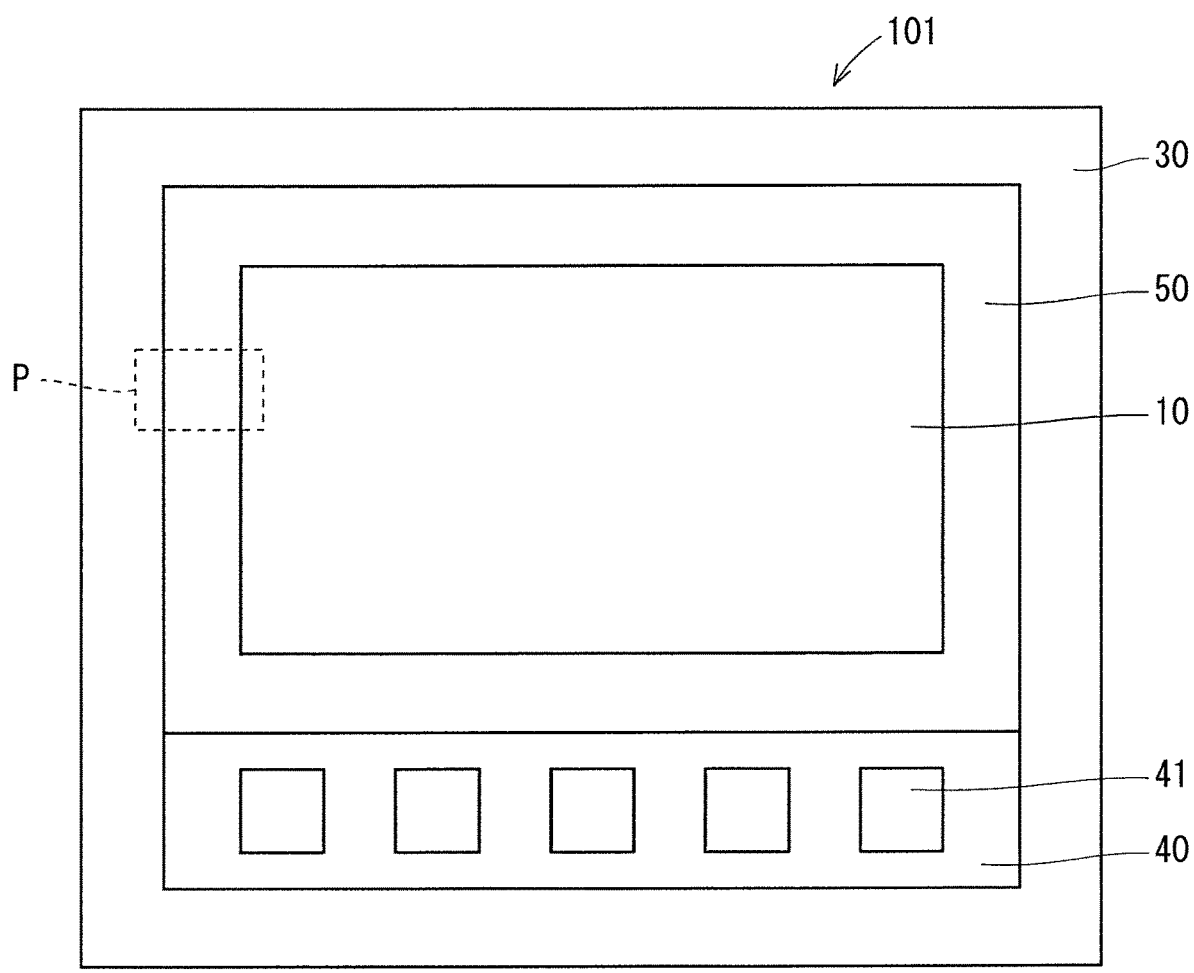
FIG. 1 is a plan view of an IGBT of Embodiment 1.

Hereinafter, Embodiments will be described with reference to the attached drawings. The drawings are schematically illustrated, the interrelationships between sizes and positions of the configurations illustrated in the different drawings are not always accurate and can be changed accordingly. In each drawing, similar components are designated by the same reference numerals and the names and functions thereof are similar. Accordingly, detailed descriptions thereof may be omitted.

In the following description, the n-type represents the first conductivity type and the p-type represents the second conductivity type. n+ type indicates that the concentration of n-type impurities is higher than that of n-type, and p+ type indicates that the concentration of p-type impurities is higher than that of p-type.

Also in the description described below, when terms specifying specific positions and directions such as "up", "low", "side", "bottom", "front", "back" and the like are used. However, these terms are used for convenience to facilitate understanding of the contents of Embodiment, and the directions in actual implementation are not limited thereby

A. Embodiment 1

<A-1. Configuration>

Figure 2:
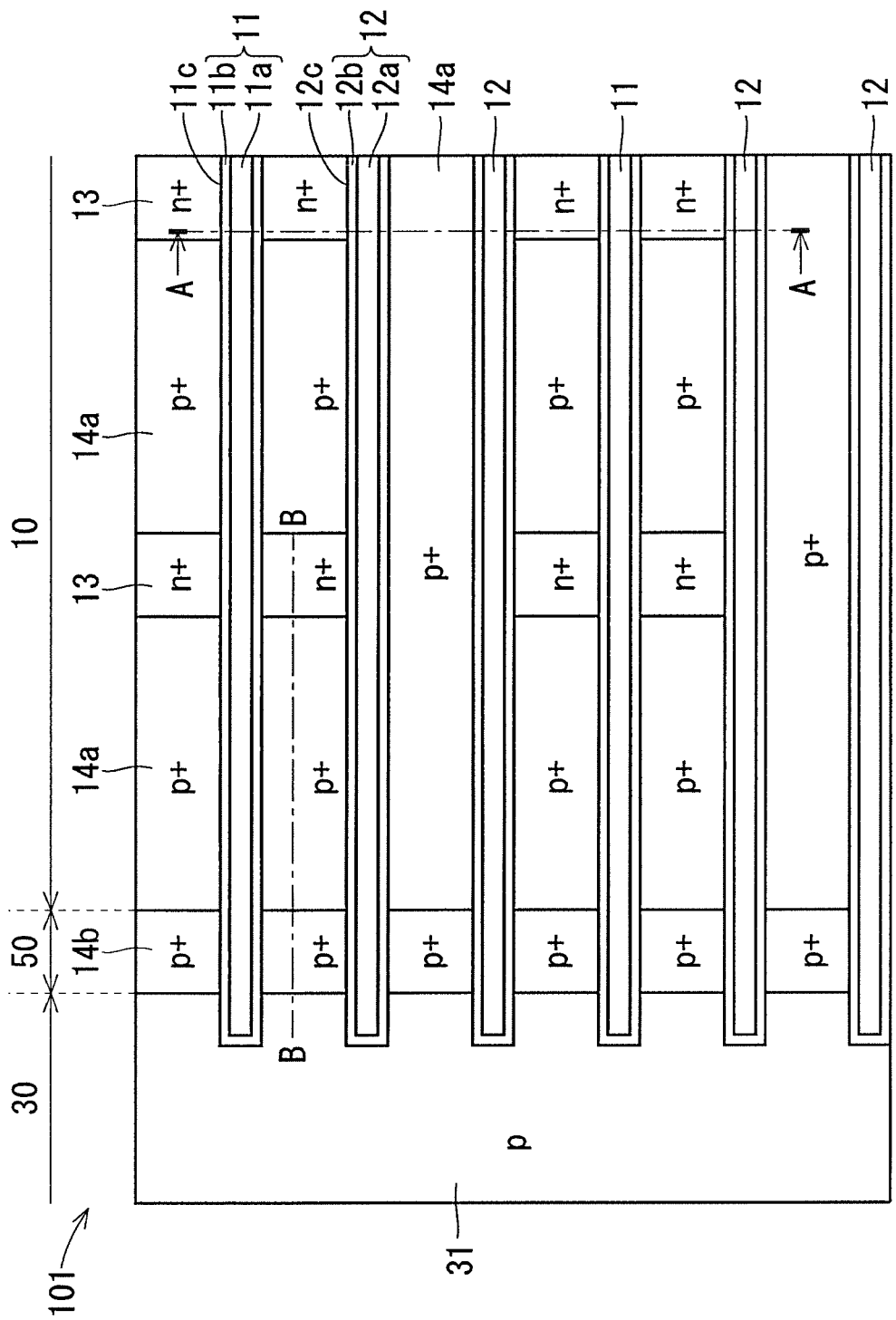
FIG. 2 is an enlarged plan view of the IGBT of Embodiment 1 in the region P of FIG. 1.
Figure 3:
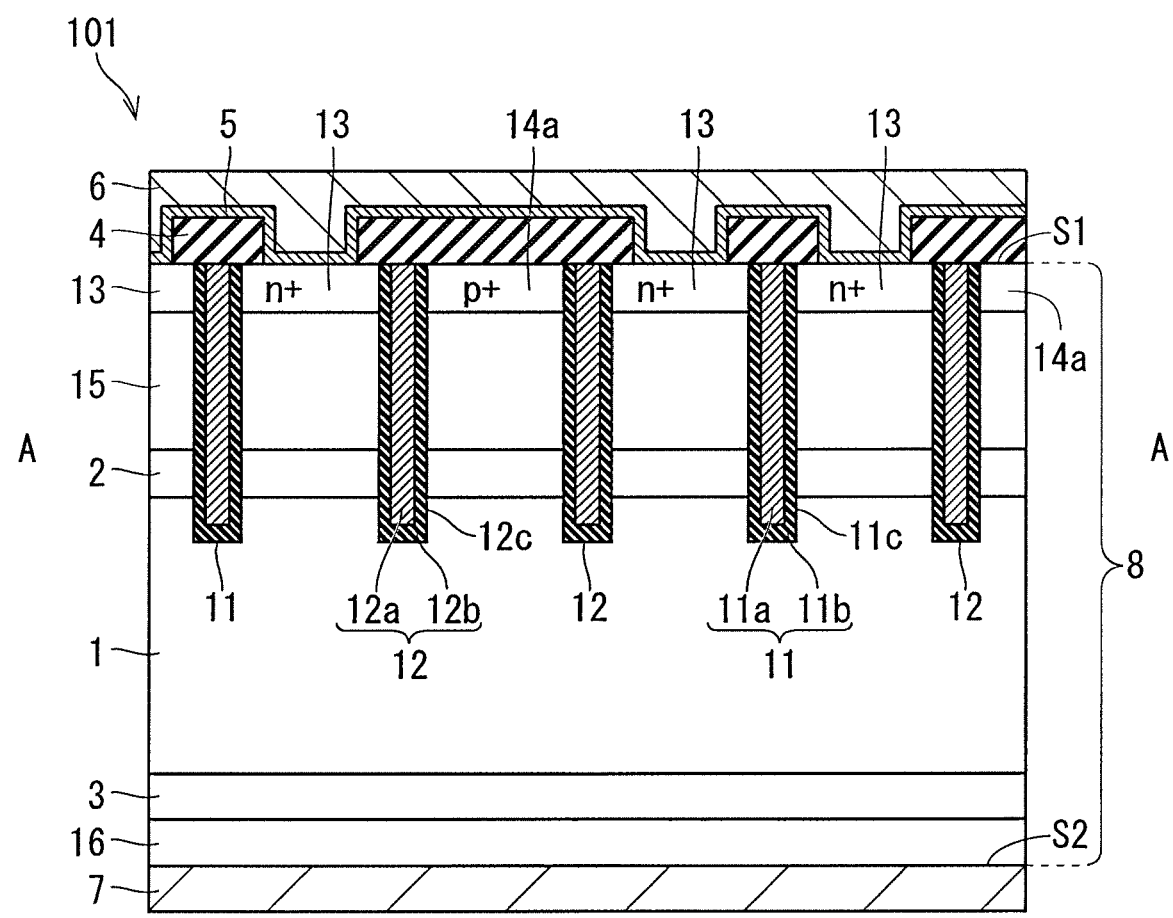
FIG. 3 is a cross-sectional view of the IGBT of Embodiment 1 along the line A-A of FIG. 2.
Figure 4:
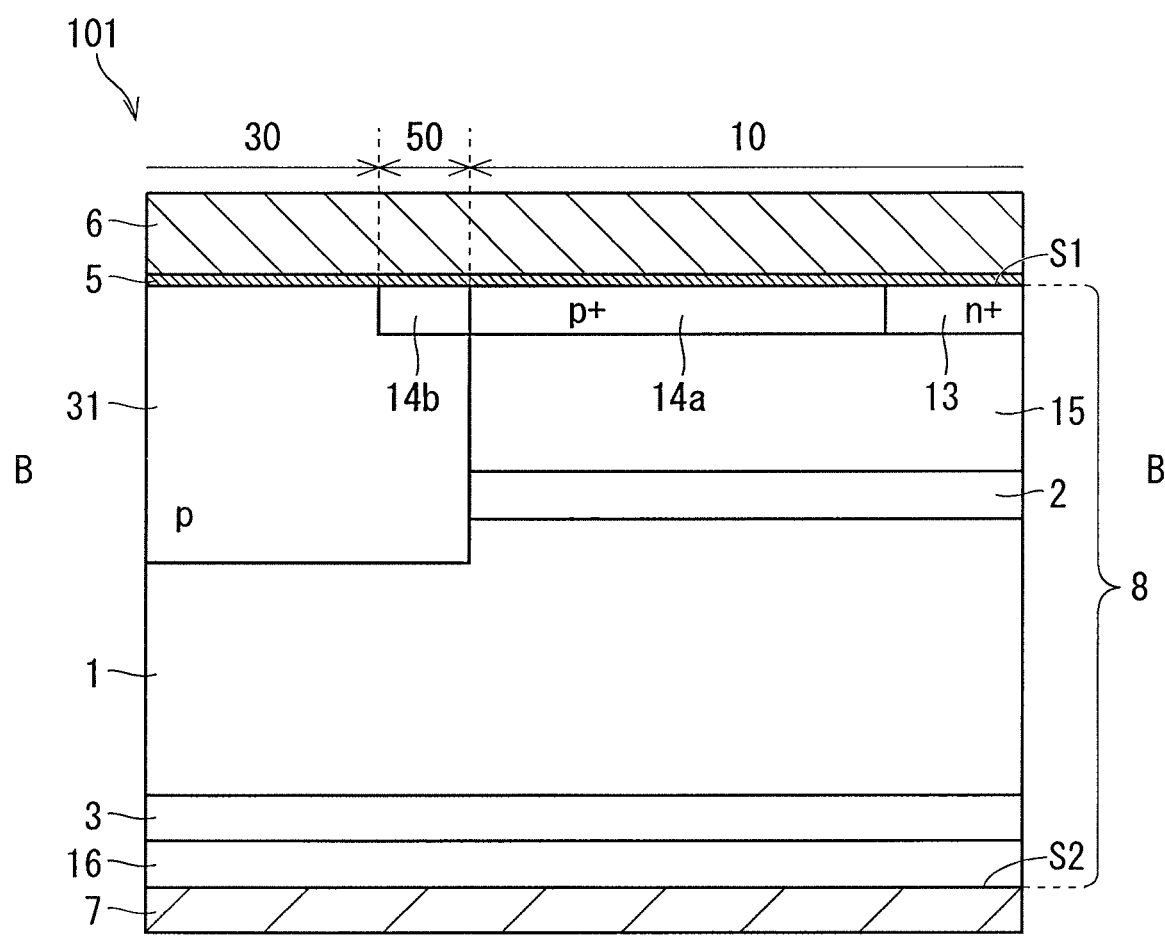
FIG. 4 is a cross-sectional view of the IGBT of Embodiment 1 along the line B-B of FIG. 2.

FIG. 1 is a plan view of an IGBT 101 being a semiconductor device of Embodiment 1. FIG. 2 is an enlarged plan view of a region P illustrated in FIG. 1 of the IGBT 101. FIG. 3 is a cross-sectional view of the IGBT 101 along the line A-A of FIG. 2. FIG. 4 is a cross-sectional view of the IGBT 101 along the line B-B of FIG. 2.

First, the planar structure of the IGBT 101 will be described. As illustrated in FIG. 1, the IGBT 101 includes an active region 10, a boundary region 50, and an edge region 30. That is, the IGBT 101 is demarcated into the active region 10, the boundary region 50, and the edge region 30 in plan view. The boundary region 50 surrounds the active region 10 in plan view. The edge region 30 surrounds the boundary region 50 in plan view. A pad region 40 including pads 41 may be provided between the boundary region 50 and the edge region 30 in plan view.

Next, with reference to FIG. 4, the cross-sectional structure of the IGBT 101 common in the active region 10, the boundary region 50, and the edge region 30 will be described. The IGBT 101 includes a semiconductor substrate 8. The semiconductor substrate 8 has a first main surface S1 and a second main surface S2 opposite to the first main surface S1. The semiconductor substrate 8 includes an n-type drift layer 1, an n-type buffer layer 3, and a p-type collector layer 16.

The buffer layer 3 is formed on the second main surface S2 side of the drift layer 1. The collector layer 16 is formed on the second main surface S2 side of the buffer layer 3. The lower surface of the collector layer 16 constitutes the second main surface S2. A collector electrode 7 is provided on the second main surface S2 of the semiconductor substrate 8.

Next, the cross-sectional structure of the IGBT 101 perculiar to the active region 10 will be described with reference to FIGS. 2 to 4. The active region 10 includes an n-type carrier storage layer 2, a p-type base layer 15, an n-type emitter layer 13, a p-type first contact layer 14a, active trench gates 11, an interlayer insulating film 4, and an emitter electrode 6.

The carrier storage layer 2 is formed on the first main surface S1 side of the drift layer 1. The base layer 2 is formed on the first main surface S1 side of the carrier storage layer 2. The emitter layer 13 and the first contact layer 14a are formed on the first main surface S1 side of the base layer 15. The upper surfaces of the emitter layer 13 and the first contact layer 14a constitute the first main surface S1. The emitter layer 13 is an impurity layer, and is a source layer when the semiconductor device is a MOSFET.

As illustrated in FIGS. 2 and 3, in the active region 10, trenches 11c are formed, which extend through the emitter layer 13 or the first contact layer 14a, the base layer 15, and the carrier storage layer 2 from the first main surface S1 to reach the drift layer 1. A gate insulating film 11b is formed on the inner walls of the trenches 11c, and a gate electrode 11a is embedded inside the trenches 11c via the gate insulating film 11b. The gate electrode 11a and the gate insulating film 11b are collectively referred to as active trench gates 11. Further, dummy trench gates 12 composed of a dummy trench electrode 12a and a dummy trench insulating film 12b may also be formed in the active region 10. That is, in the active region 10, trenches 12c are formed, which extend through the emitter layer 13 or the first contact layer 14a, the base layer 15, and the carrier storage layer 2 from the first main surface S1 to reach the drift layer 1. And the dummy trench insulating film 12b is formed on the inner walls of the trenches 12c, and the dummy trench electrode 12a is embedded inside the trenches 12c via the dummy trench insulating film 12b.

As illustrated in FIGS. 3 and 4, a barrier metal 5 may be formed between the emitter electrode 6 and the interlayer insulating film 4, the emitter layer 13, the first contact layer 14a, a second contact layer 14b, and the well layer 31. The emitter electrode 6 is composed of a metal such as Al or AlSi. The barrier metal 5 is composed of, for example, Ti, TiN, TiSi, or the like, and may include plugs composed of W or the like.

As illustrated in FIG. 3, the emitter electrode 6 is formed on the upper portions of the gate electrodes 11a via an interlayer insulating film 4. Then, the emitter layer 13 and the first contact layer 14a are connected to the emitter electrode 6 via the contact holes.

Next, the cross-sectional structure of the IGBT 101 peculiar to the edge region 30 and the boundary region 50 will be described with reference to FIGS. 2 to 4. In the edge region 30 and the boundary region 50, the p-type well layer 31 is formed on the first main surface S1 side of the drift layer 1. In the boundary region 50, the p-type second contact layer 14b is formed on the first main surface S1 side of the p-type well layer 31. The second contact layer 14b is continuous with the first contact layer 14a of the active region 10. The upper surface of the well layer 31 in the edge region 30 constitutes the first main surface S1 and the upper surface of the second contact layer 14b in the boundary region 50 constitutes the first main surface S1.

The n-type impurity concentration of the second contact layer 14b is the same as the n-type impurity concentration of the drift layer 1. Meanwhile, the n-type impurity concentration of the first contact layer 14a is equal to or higher than the n-type impurity concentration of the drift layer 1. The net impurity concentration of the first contact layer 14a is lower than the net impurity concentration of the second contact layer 14b. The net impurity concentration refers, in the n-type region, to the concentration obtained by subtracting the p-type impurity concentration from the n-type impurity concentration in the n-type region, and the concentration obtained by subtracting the n-type impurity concentration from the p-type impurity concentration in the p-type region.

<A-2. Manufacturing Process>

Figure 6:
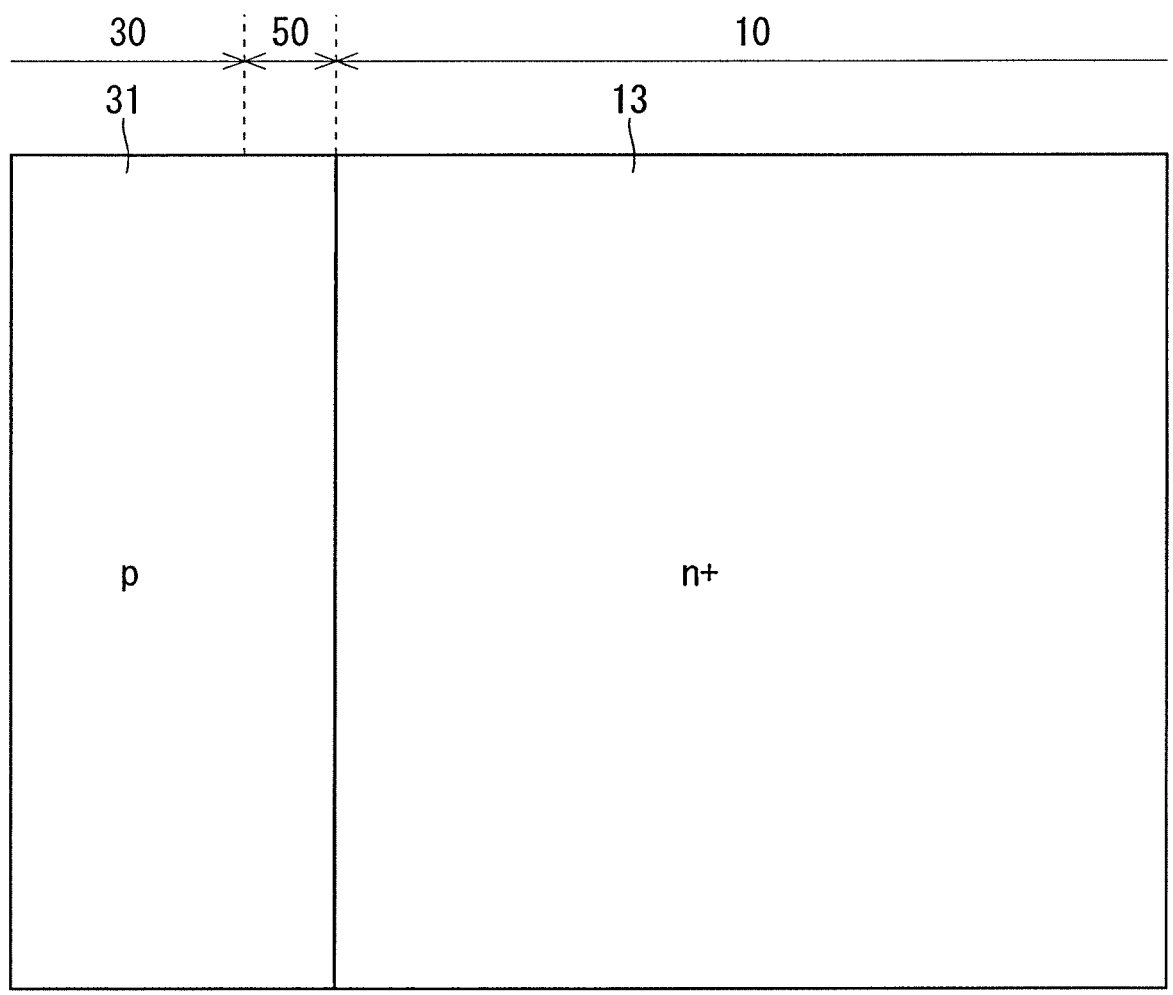
FIG. 6 is a plan view illustrating a manufacturing process of the IGBT of Embodiment 1.
Figure 7:
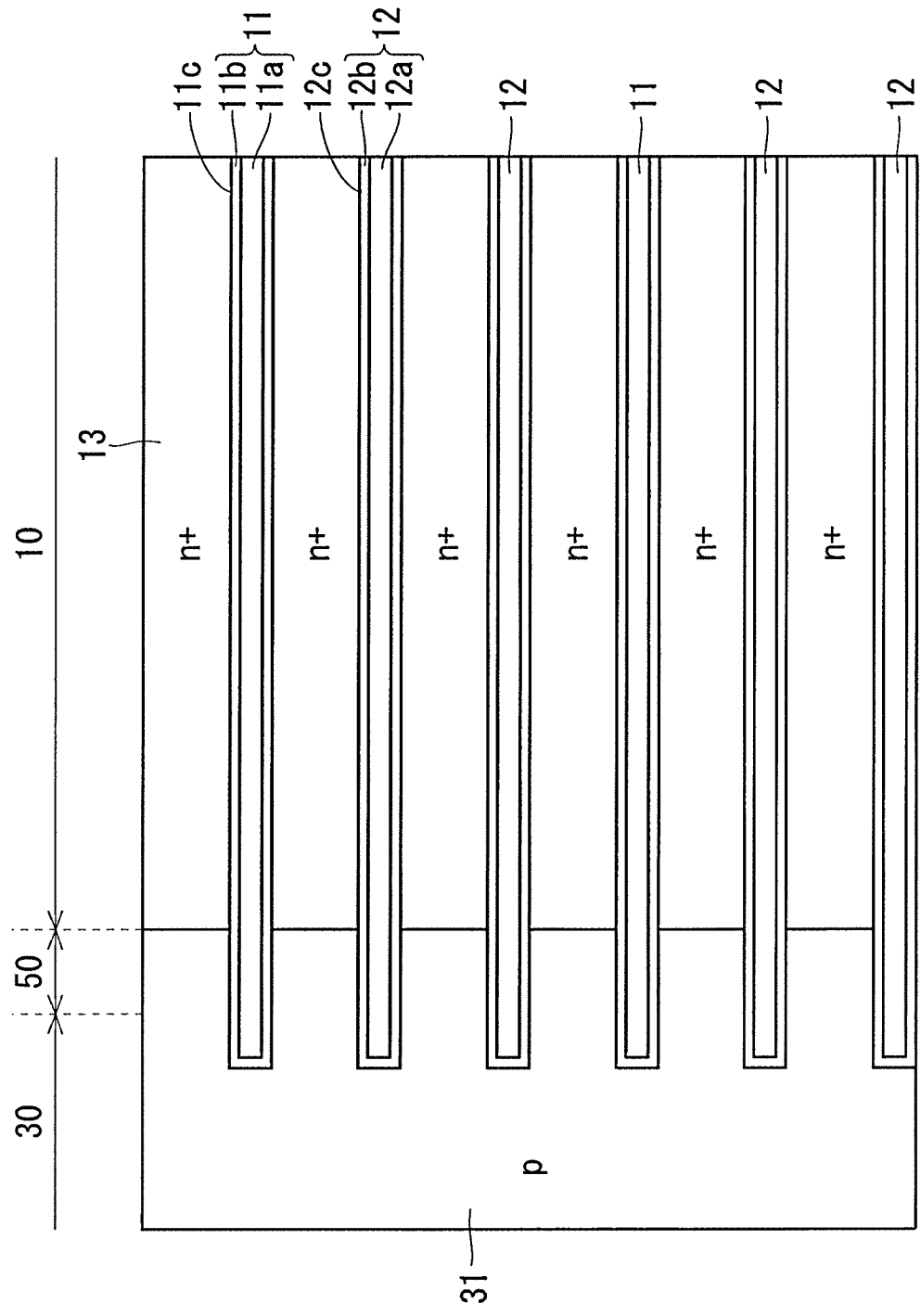
FIG. 7 is a plan view illustrating a manufacturing process of the IGBT of Embodiment 1.
Figure 8:
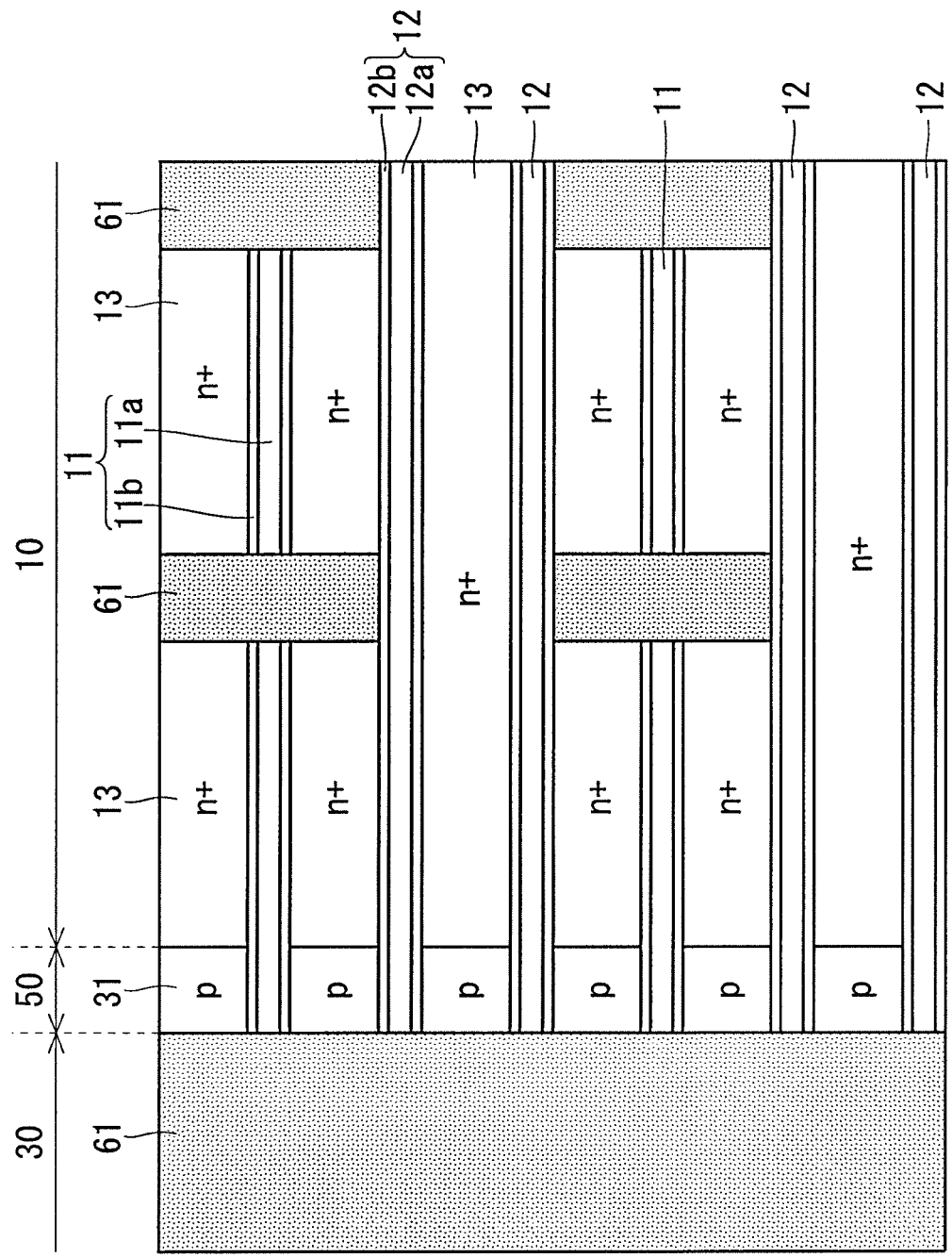
FIG. 8 is a plan view illustrating a manufacturing process of the IGBT of Embodiment 1.

FIG. 5 is a flowchart illustrating a method of manufacturing the IGBT 101 of Embodiment 1. FIGS. 6 to 8 are plan views illustrating states the IGBT 101 is being manufactured. Hereinafter, a method of manufacturing the IGBT 101 will be described with reference to FIGS. 5 to 8. The method of manufacturing the IGBT 101 described below is also applied to an IGBT 103 of Embodiment 2 described later.

First, an n-type semiconductor substrate is prepared in Step S101. The semiconductor substrate has the first main surface S1 and the second main surface S2, and corresponds to the semiconductor substrate 8 illustrated in FIGS. 3 and 4. The semiconductor substrate, at this stage, contains only the drift layer 1 and has not yet contained the carrier storage layer 2, the buffer layer 3, the collector layer 16, the base layer 15, the first contact layer 14a, and the emitter layer 13.

Next, in Step S102, the p-type well layer 31 is formed on the first main surface S1 side of the outer peripheral portion of the semiconductor substrate. In plan view, the region where the well layer 31 of the semiconductor substrate is formed becomes the edge region 30 and the boundary region 50, and the region where the well layer 31 is not formed becomes the active region 10.

Then, in Step S103, a first mask is formed on the first main surface S1 of the semiconductor substrate. The first mask covers the edge region 30 and the boundary region 50 and has an opening throughout the active region 10.

Next, in Step S104, the n-type impurity ions are implanted into the active region 10 using the first mask to form the carrier storage layer 2. Next, in Step S105, the p-type impurity ions are implanted into the active region 10 using the first mask to form the base layer 15. Next, in Step S106, the n-type impurity ions are implanted into the active region 10 using the first mask to form the emitter layer 13 on the base layer 15. In this manner, the planar configuration illustrated in FIG. 6 is obtained. In addition, each ion implantation in Steps S104 to S106 may be performed in the boundary region 50 in addition to the active region 10.

Next, in Step S107, the active trench gates 11 and the dummy trench gates 12 are formed in the boundary region 50 and the active region 10, and the planar configuration illustrated in FIG. 7 is obtained.

Then, in Step S108, a second mask 61 is formed as illustrated in FIG. 8. The second mask 61 has a pattern different from that of the first mask, and has an opening in the boundary region 50 and an opening in part of the active region 10.

Next, in Step S109, the p-type impurity ions are implanted into a part of the active region 10 and the boundary region 50 using the second mask 61. Here, the amount of ion implantation per unit area is referred to as the dosage. The dosage of the p-type impurity ions in Step S109 is greater than the dosage of the n-type impurity ions implanted to form the emitter layer 13 in Step S106. Therefore, in the emitter layer 13, the regions into which the p-type impurity ions are implanted in Step S109 change the conductivity type to the p-type and become the first contact layer 14a. In the emitter layer 13, the regions covered with the second mask 61, where the p-type impurity ions are not implanted in Step S109, remain as the emitter layer 13 as it is. In this manner, the planar configuration illustrated in FIG. 2 is obtained.

As described above, after forming the emitter layer 13 using the first mask for forming the carrier storage layer 2 and the base layer 15, the regions in the emitter layer 13 are converted into the first contact layer 14a; thereby, reducing masks for forming the emitter layer 13.

Further, by implanting the p-type impurity ions into the boundary region 50 in Step S109, the second contact layer 14b is formed on the first main surface S1 side of the well layer 31. The second contact layer 14b is formed by implanting the p-type impurity ions into the p-type well layer 31; therefore, the net impurity concentration thereof is higher than that of the first contact layer 14a. Forming the second contact layer 14b in the boundary region 50 suppresses the emitter layer 13 from being formed in the edge region 30 due to manufacturing variations, and ensures improvement in the fracture resistance. In Step S109, the ion implantation does not have to be performed in the boundary region 50.

Next, in Step S110, the interlayer insulating film 4 is formed on the first main surface S1 of the semiconductor substrate, and contact holes are further formed.

Then, in Step S111, the barrier metal 5 and the emitter electrode 6 are formed. Further, the formation of the configuration on the second main surface S2 side of the semiconductor substrate, that is, the buffer layer 3, the collector layer 16, and the collector electrode 7 are appropriately performed.

The ion implantation was performed in Steps S104 to S106 and S109. The activation annealing for activating the implanted ions may be performed each time after each ion implantation step, or may be performed collectively after the completion of all the ion implantation steps. Further, although in Step S107, the active trench gates 11 and the dummy trench gates 12 are formed, the heat treatment at the time of forming the gate insulating film 11*b* and the dummy trench insulating film 12*b* may also serve as the activation annealing for the ions implanted before the heat treatment. In this case, the manufacturing cost can be reduced.

The formation of the first mask and the ion implantation using the first mask described in Steps S103 to S106 may be performed before the formation of the well layer 31 described in Step S102. Further, the formation of the second mask 61 and the ion implantation using the second mask 61 described in Steps S108 and S109 may be performed before the formation of the active trench gates 11 and the dummy trench gates 12 described in Step S107. The active trench gates 11 and the dummy trench gates 12 are collectively referred to as trench gates.

Forming the trench gates in Step S107 creates steps on the first main surface S1 of the semiconductor substrate 8. However, according to the above manufacturing method, in Steps S104 to S106 before forming the trench gates, ion implantation is performed on the flat first main surface S1 of the semiconductor substrate 8, and the base layer 15, the carrier storage layer 2, and the emitter layer 13 can be formed. Therefore, the variation in the impurity profile caused by the steps on the surface of the semiconductor substrate 8 is suppressed.

In the above manufacturing method, the base layer 15 and the emitter layer 13 are formed by ion implantation using the same first mask. Therefore, the heat treatment applied after each ion implantation is the same. Therefore, if the diffusion coefficient of the p-type impurities constituting the base layer 15 in the semiconductor substrate 8 is smaller than the diffusion coefficient of the n-type impurities constituting the emitter layer 13 in the semiconductor substrate 8, the entire base layer 15 changes into the emitter layer 13 as illustrated in FIG. 9, and the IGBT does not operate. Therefore, the diffusion coefficient of the p-type impurities constituting the base layer 15 in the semiconductor substrate 8 must be greater than the diffusion coefficient of the n-type impurities constituting the emitter layer 13 in the semiconductor substrate 8.

<A-3. Modification>

FIG. 10 is a cross-sectional view of an IGBT 101A of Modification of Embodiment 1 along the line B-B of FIG. 2. Other cross-sectional configurations and planar configurations of the IGBT 101A are the same as those of the IGBT 101 of Embodiment 1. In the IGBT 101A, the first contact layer 14*a* is formed not only in the active region 10 but also in a part of the boundary region 50. Such a configuration is realized by the opening of the first mask used for ion implantation when forming the carrier storage layer 2, the base layer 15, and the emitter layer 13 including not only the entire active region 10 but also a part of the boundary region 50. That is, as illustrated in FIG. 10, an end portion EC being a region in which the n-type impurity ions constituting the carrier storage layer 2 are implanted and an end portion EB being a region in which the p-type impurity ions constituting the base layer 15 are implanted are both located within the boundary region 50 and overlap the well layer 31. The reduction of breakdown voltage, caused by the well layer 31 and the base layer 15 being separated from each other due to manufacturing variations, is suppressed by overlapping the well layer 31 and the base layer 15 in this manner.

<A-4. Effects>

The method of the manufacturing the semiconductor device of Embodiment 1 includes a step (a) of forming the first mask on the first main surface S1 of the semiconductor substrate 8 having the drift layer 1 of the first conductivity type, a step (b) of forming the base layer 15 of the second conductivity type on the first main surface S1 side of at least a part a region of the drift layer 1 in the active region by implanting the impurity ions of the second conductivity type into the first main surface S1 of the semiconductor substrate 8 using the first mask, a step of (c) of forming the impurity layer of the first conductivity type on the first main surface S1 side of the base layer 15 by implanting the impurity ions of the first conductivity type into the first main surface S1 of the semiconductor substrate 8 using the first mask, a step (d) of forming the trenches 11*c* reaching the drift layer 1 from the first main surface S1 of the semiconductor substrate 8 after the steps (b) and (c), a step (e) of embedding the gate electrode 11*a* inside the trenches 11*c* via the gate insulating film 11*b*, a step (f) of forming the second mask having a different pattern from that of the first mask on the first main surface S1 of the semiconductor substrate 8, and a step (g) of converting a part of the impurity layer into the first contact layer 14*a* of the second conductivity type by implanting the impurity ions of the second conductivity type having the dosage higher than that of the impurity ions of the first conductivity type implanted at the step (c) into the first main surface S1 of the semiconductor substrate 8 using the second mask. As a result, masks for forming the emitter layer 13 can be reduced. Further, the variation in the impurity profile caused by the steps on the surface of the semiconductor substrate 8 is suppressed because the ion implantation into the flat first main surface S1 of the semiconductor substrate 8 is performed to form the base layer 15, the carrier storage layer 2, and the emitter layer 13, before forming the trench gates.

The method of manufacturing the semiconductor device of Embodiment 1 further includes a step (h) of forming the well layer 31 of the second conductivity type in the semiconductor substrate 8 in the boundary region 50 and the edge region 30, and the step (g) may also be a step of forming the second contact layer 14*b* of the second conductivity type on the first main surface S1 side of the well layer 31 in the boundary region 50 at the same time as when the part of the impurity layer is converted into the first contact layer 14*a*. The net impurity concentration of the second contact layer 14*b* is higher than the net impurity concentration of the first contact layer 14*a*. Forming the second contact layer 14*b* in the boundary region 50 suppresses the emitter layer 13 from being formed in the edge region 30 due to manufacturing variations, and ensures improvement in the fracture resistance.

B. Embodiment 2

<B-1. Configuration>

Figure 11:
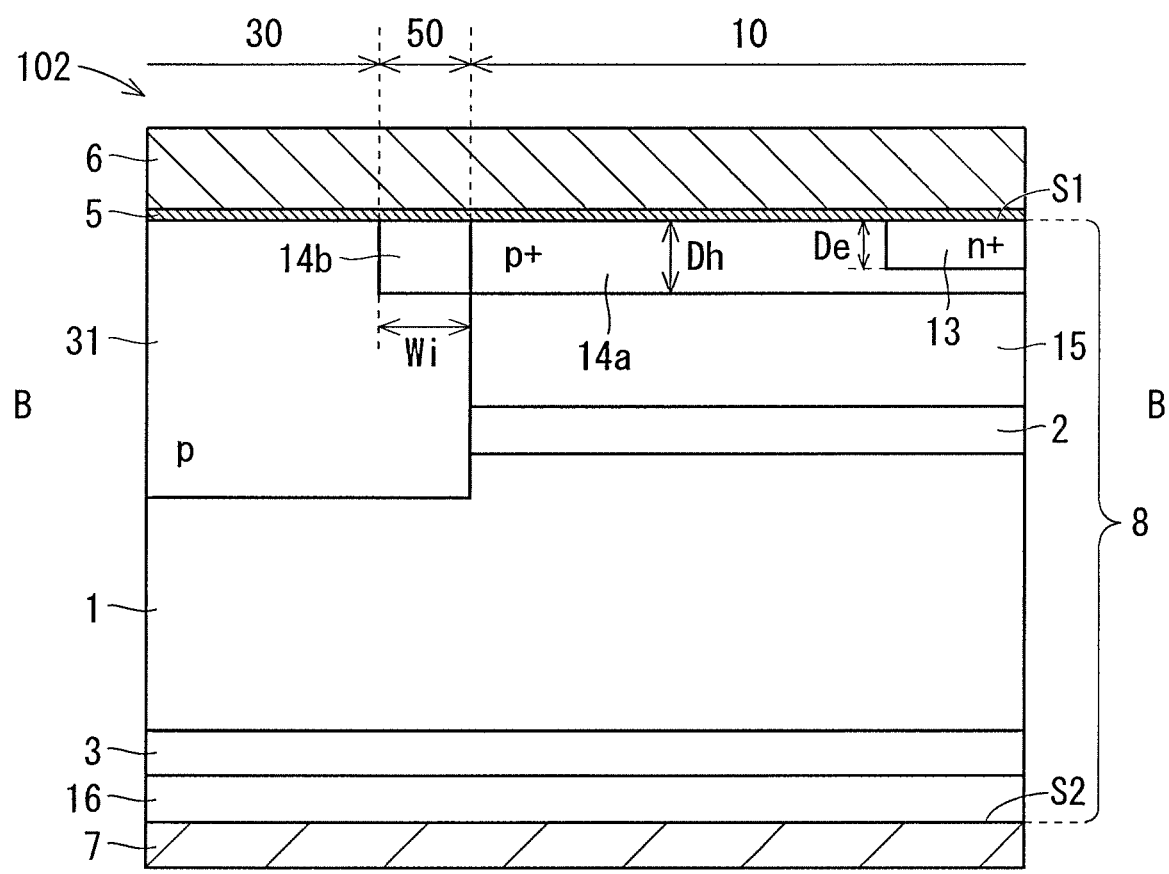
FIG. 11 is a cross-sectional view of an IGBT of Embodiment 2 corresponding to FIG. 4.

FIG. 11 is a cross-sectional view of an IGBT 102 of Embodiment 2 along the line B-B of FIG. 2. Other cross-sectional configurations and planar configurations of the IGBT 102 are the same as those of the IGBT 101 of Embodiment 1.

In the IGBT 102, the width Wi of the boundary region 50 is greater than the depth De of the emitter layer 13. Further, in the IGBT 102, the depth Dh of the first contact layer 14*a* and the second contact layer 14*b* is deeper than the depth De of the emitter layer 13.

<B-2. Effects>

In the IGBT 102 of Embodiment 2, the width Wi of the boundary region 50 is greater than the depth De of the emitter layer 13. Therefore, the n-type impurity ions implanted to form the emitter layer 13 do not reach the edge region 30 even if the semiconductor substrate 8 is diffused in the lateral direction. As a result, the formation of the parasitic emitter layer on the surface of the edge region 30 is suppressed, and improvement in the fracture resistance is ensured.

Figure 12:
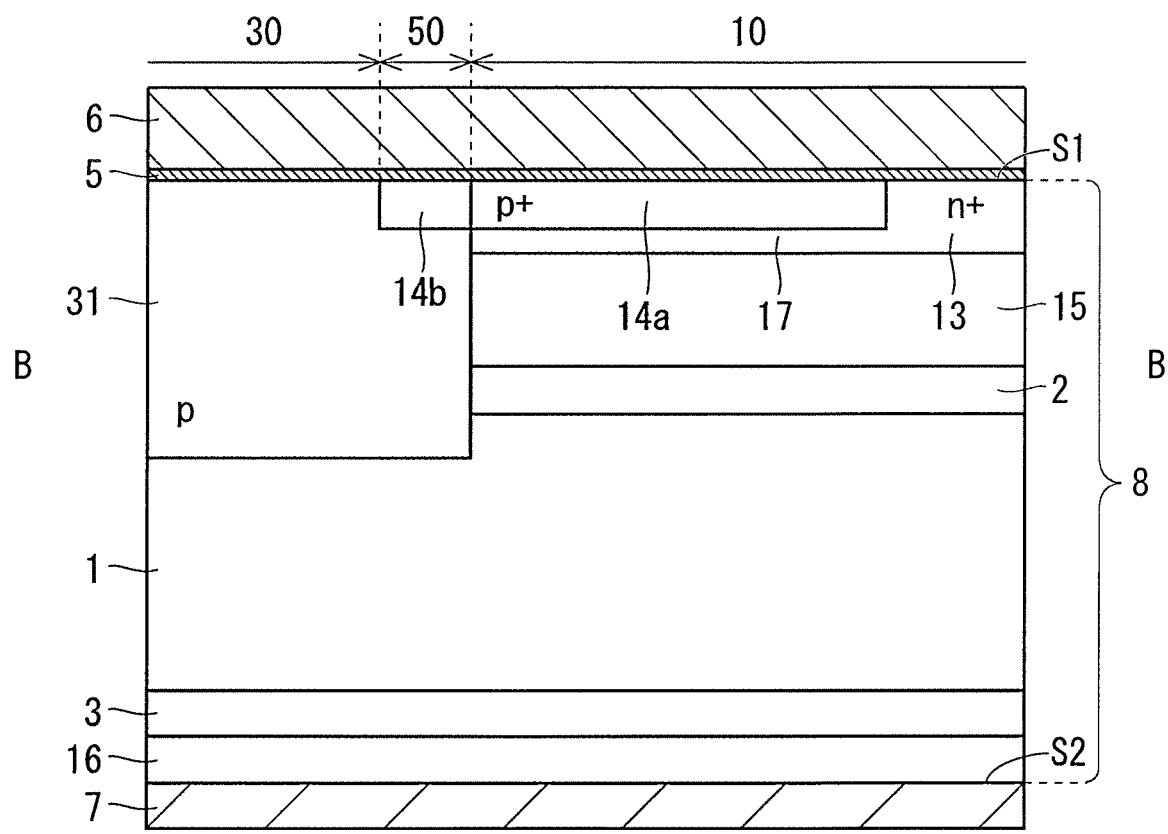
FIG. 12 is a cross-sectional view of an IGBT illustrating a problem when a first contact layer is shallower than an emitter layer.

Also, in the IGBT 102 of Embodiment 2, the depth Dh of the first contact layer 14a is greater than the depth De of the emitter layer 13. As described in <A-2>, the first contact layer 14a is formed by implanting the p-type impurity ions into the emitter layer 13 to convert the conductivity type from n-type to p-type. Therefore, assuming that the depth Dh of the first contact layer 14a and the second contact layer 14b is shallower than the depth De of the emitter layer 13, as illustrated in FIG. 12, the emitter layer 13 remains on the second main surface S2 side of the first contact layer 14a, resulting in an n-type parasitic emitter layer 17. According to the IGBT 102, the formation of the parasitic emitter layer 17 is suppressed by the above configuration, so that the fracture resistance is improved.

C. Embodiment 3

<C-1. Configuration>

Figure 13:
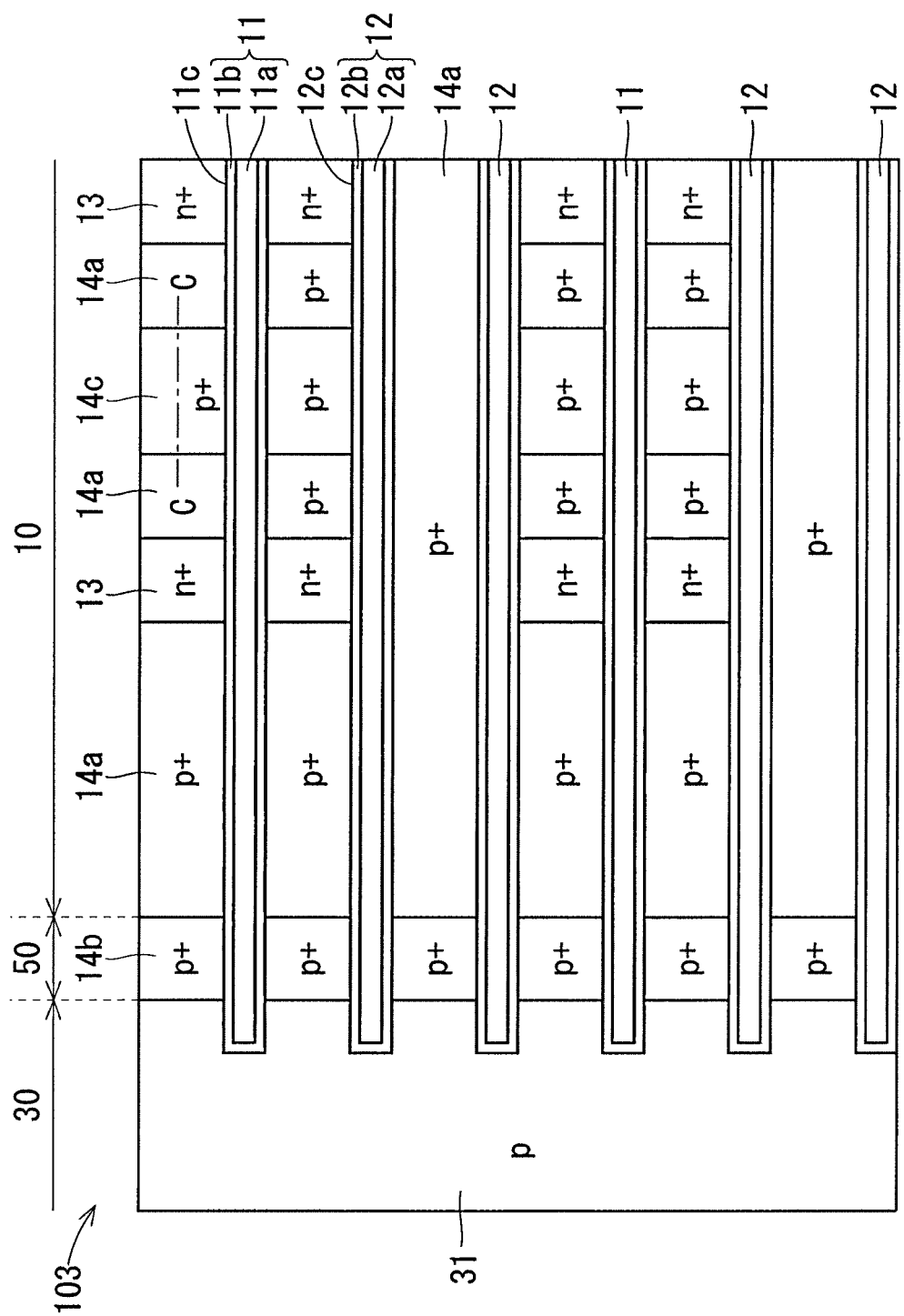
FIG. 13 is an enlarged plan view of an IGBT of Embodiment 3 corresponding to FIG. 2.
Figure 14:
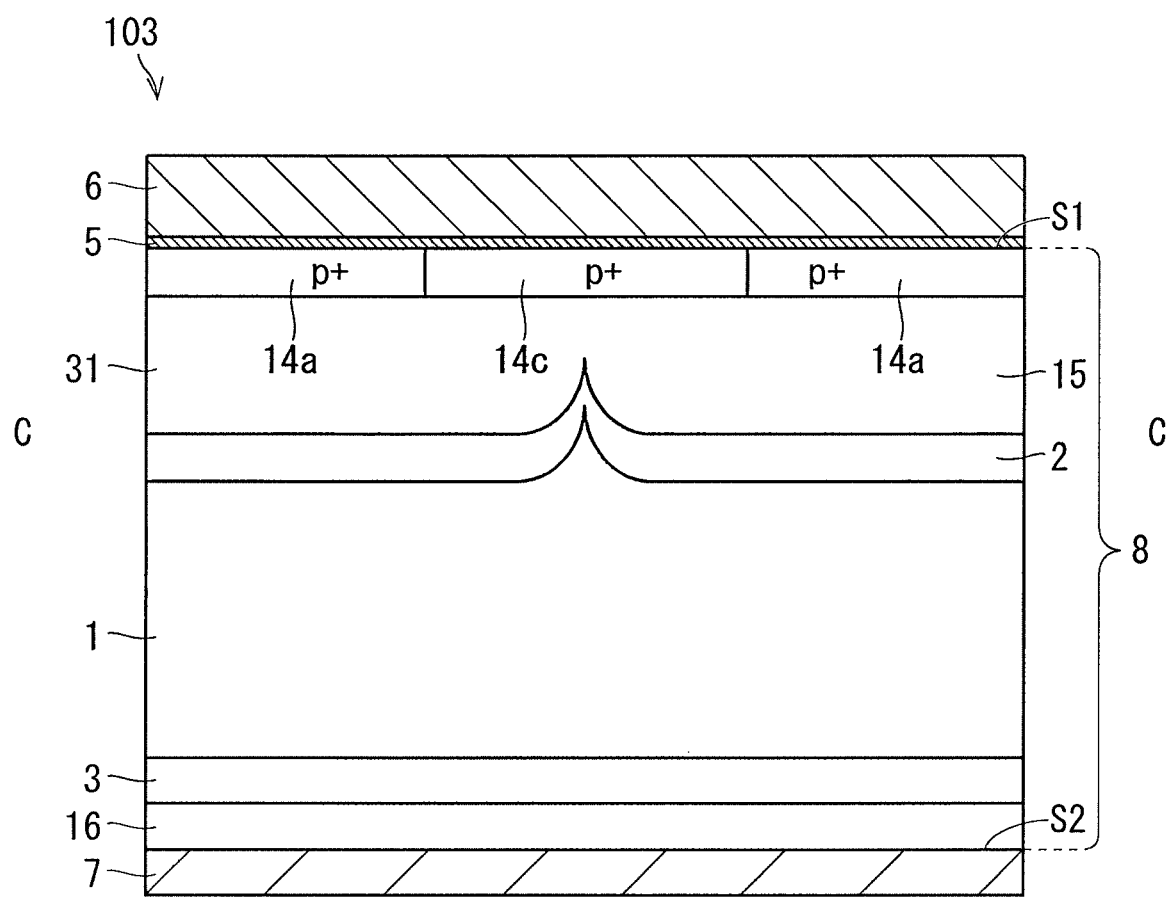
FIG. 14 is a cross-sectional view of the IGBT of Embodiment 3 along the line C-C of FIG. 13.

FIG. 13 is an enlarged plan view of the IGBT 102 of Embodiment 2 in the region P of FIG. 1. FIG. 14 is a cross-sectional view of the IGBT 103 along the line C-C of FIG. 13. As illustrated in FIGS. 13 and 14, the IGBT 103 has a p-type third contact layer 14c interposed between the first contact layers 14a on both sides in the active region 10 and is otherwise similar to the IGBT 101.

The third contact layer 14c does not contain n-type impurities having a concentration equal to or higher than the n-type impurity concentration of the drift layer 1. The net impurity concentration of the third contact layer 14c is higher than the net impurity concentration of the first contact layer 14a. In FIG. 14, although the base layer 15 and the carrier storage layer 2 immediately below the third contact layer 14c are locally shallow, the base layer 15 and the carrier storage layer 2 may be uniformly formed as in the IGBT 101 of Embodiment 1.

The base layer 15 and the carrier storage layer 2 directly below the third contact layer 14c are formed by lateral diffusion of the base layer 15 and the carrier storage layer 2 directly below the adjacent first contact layers 14a. Therefore, the depths of the base layer 15 and the carrier storage layer 2 immediately below the third contact layer 14c can be controlled by the diffusion depth of the base layer 15 and the carrier storage layer 2, the intervals between the trench gates, and the like.

<C-2. Manufacturing Process>

The manufacturing process of the IGBT 103 of embodiment 3 is basically the same as the manufacturing process of the IGBT 101 of Embodiment 1 described in <A-2>; therefore, only the differences therebetween will be mainly described below.

After forming the well layer 31 in the edge region 30 and the boundary region 50 of the semiconductor substrate 8, the first mask is formed on the first main surface S1 of the semiconductor substrate 8. The first mask has an opening throughout the active region 10 in Embodiments 1 and 2. On the other hand, in Embodiment 3, the first mask covers the formation region of the third contact layer 14c in the active region 10 and has an opening in the other region.

Next, the n-type impurity ions are implanted using the first mask to form the carrier storage layer 2. Next, the p-type impurity ions are implanted using the first mask to form the base layer on the carrier storage layer 2. Next, the n-type impurity ions are implanted using the first mask to form the emitter layer 13 on the base layer 15. As described above, the first mask covers the formation region of the third contact layer 14c; therefore, ions are not directly implanted in the formation region of the third contact layer 14c and the region immediately below the formation region in the ion implantation steps. However, when the implanted ions diffuse in the lateral direction of the semiconductor substrate 8, the carrier storage layer 2 and the base layer 15 are also formed in the formation region of the third contact layer 14c and immediately below the formation region. However, for the emitter layer 13, the diffusion depth of the n-type impurity ions is adjusted so that the emitter layer 13 is not formed in the formation region of the third contact layer 14c.

Next, the first mask is removed and the second mask is formed on the first main surface S1 of the semiconductor substrate 8. The second mask has a pattern different from that of the first mask, and has an opening throughout the boundary region 50 and an opening in part of the active region 10. In particular, an opening of the second mask is provided in the region of the active region 10 covered by the first mask.

Next, the p-type impurity ions are implanted using the second mask to form the first contact layer 14a, the second contact layer 14b, and the third contact layer 14c. Specifically, the p-type impurity ions are implanted into the region of the active region 10 where the emitter layer 13 is formed, which is located at the opening of the first mask, to form the first contact layer 14a. Further, the p-type impurity ions are implanted into the well layer 31 of the boundary region 50 to form the second contact layer 14b. Specifically, the p-type impurity ions are implanted into the region of the active region 10 where the emitter layer 13 is not formed due to the covering by the first mask, to form the third contact layer 14c. In this manner, the first contact layer 14a, the second contact layer 14b, and the third contact layer 14c having different net impurity concentrations are formed by one ion implantation step. The net impurity concentration is higher in the order of the second contact layer 14b, the third contact layer 14c, and the first contact layer 14a.

<C-3. Effects>

According to the method of manufacturing the IGBT 103 of Embodiment 3, a part of the emitter layer 13 being an impurity layer is converted into the first contact layer 14a, and at the same time, the third contact layer 14c of the second conductivity type is formed in the drift layer 1 in contact with the first main surface S1 of the semiconductor substrate 8 in the active region 10. The third contact layer 14c does not contain the impurities of the first conductivity type having the concentration higher than the concentration of the impurities of the first conductivity type of the drift layer 1, and the net impurity concentration of the third contact layer 14c is higher than the net impurity concentration of the first contact layer 14a. The third contact layer 14c is more highly capable of pulling out holes at the turn-off of the IGBT 103 than the first contact layer 14a is; therefore, the fracture resistance of the IGBT 103 is improved.

D. Embodiment 4

<D-1. Configuration>

Figure 15:
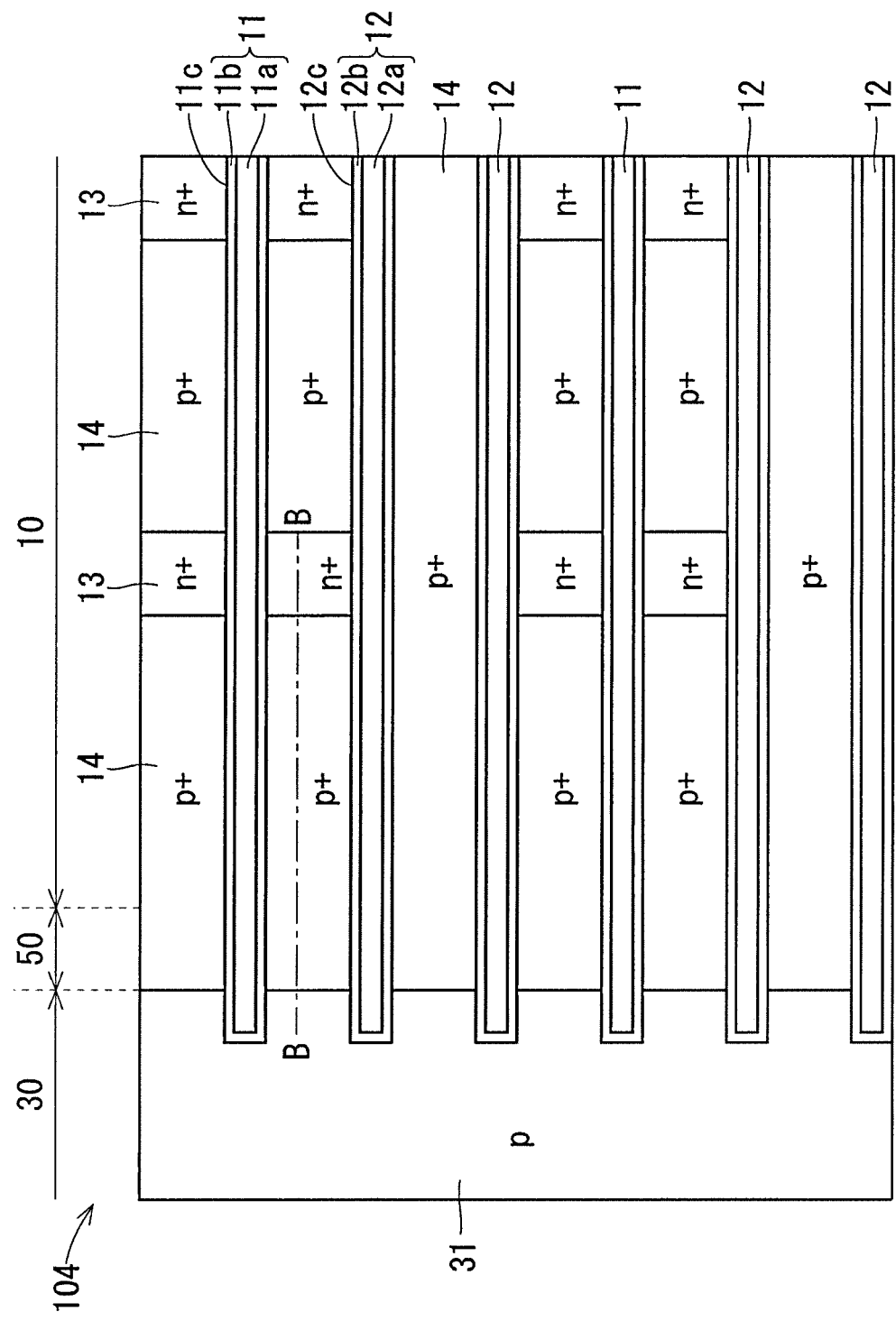
FIG. 15 is an enlarged plan view of an IGBT of Embodiment 4 corresponding to FIG. 2.

FIG. 15 is an enlarged plan view of an IGBT 104 of Embodiment 4 in the region P of FIG. 1. FIG. 16 is a cross-sectional view of the IGBT 104 along the line B-B of FIG. 15. Hereinafter, a method of manufacturing the IGBT 104 will be described with reference to FIGS. 15 and 16.

Compared to the IGBT 101, the IGBT 104 includes a first well layer 31a, a second well layer 31b, and a third well layer 31c instead of the well layer 31, and a p-type contact layer 14 instead of the first contact layer 14a and the second contact layer 14b. The first well layer 31a, the second well layer 31b, the third well layer 31c, and the contact layer 14 are all p-type.

In the active region 10, the contact layer 14 is formed on the first main surface S1 side of the base layer 15.

In the edge region 30 and the boundary region 50, the first well layer 31a is formed on the first main surface S1 side of the drift layer 1.

In the boundary region 50, the second well layer 31b is formed on the first main surface S1 side of the first well layer 31a. The third well layer 31c is formed between the second well layer 31b and the first well layer 31a. The contact layer 14 is formed on the first main surface S1 side of the second well layer 31b. The contact layer 14 in the active region 10 is continuous with the contact layer 14 in the boundary region 50. The second well layer 31b has a net concentration higher than that of the first well layer 31a. The third well layer 31c has a net concentration higher than that of the first well layer 31a.

The emitter layer 13 contains the impurities of the second conductivity type having the concentration higher than that of the base layer 15. The net impurity concentration of the emitter layer 13 is lower than the net impurity concentration of the contact layer 14.

<C-2. Manufacturing Process>

Figure 18:
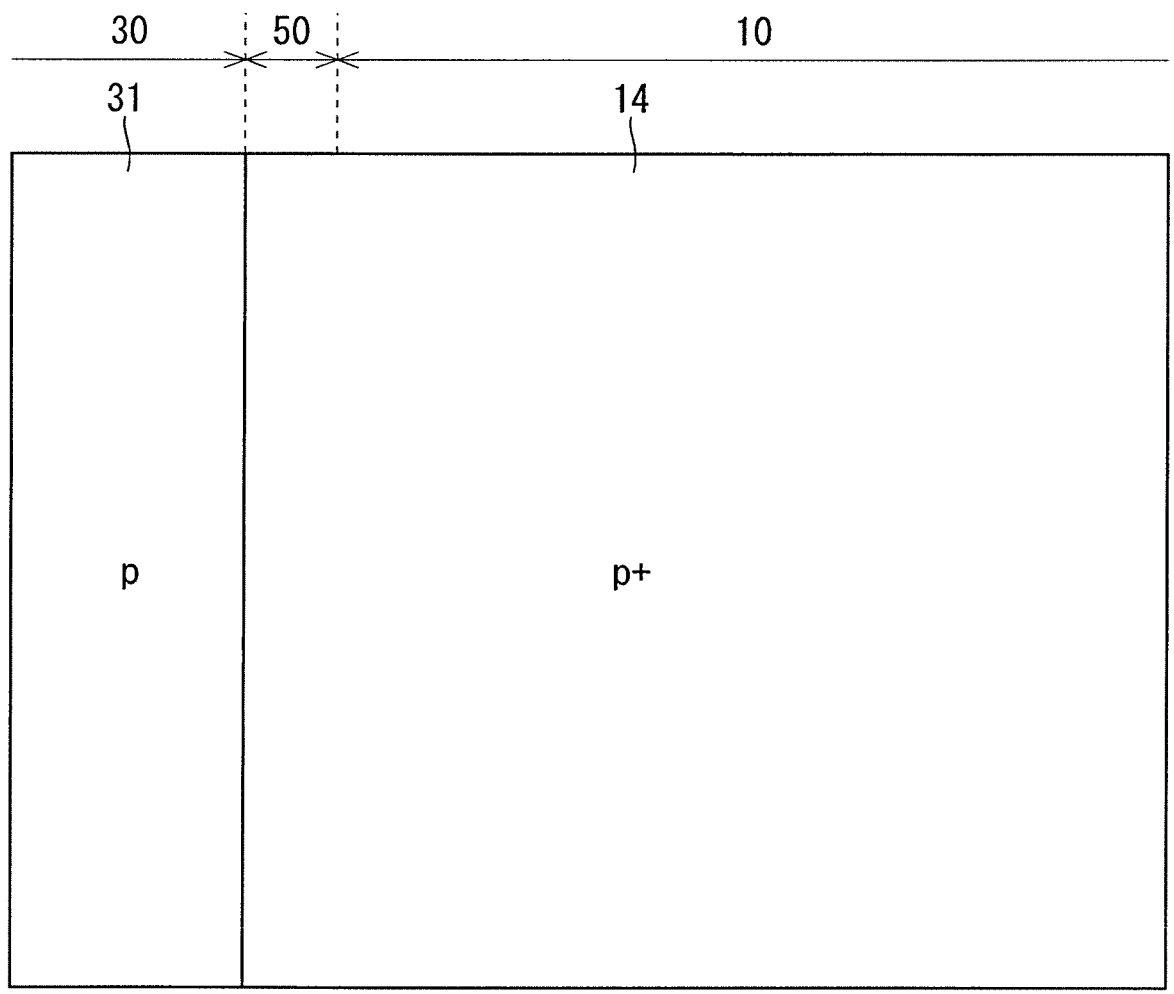
FIG. 18 is a plan view illustrating a manufacturing process of the IGBT of Embodiment 4.
Figure 19:
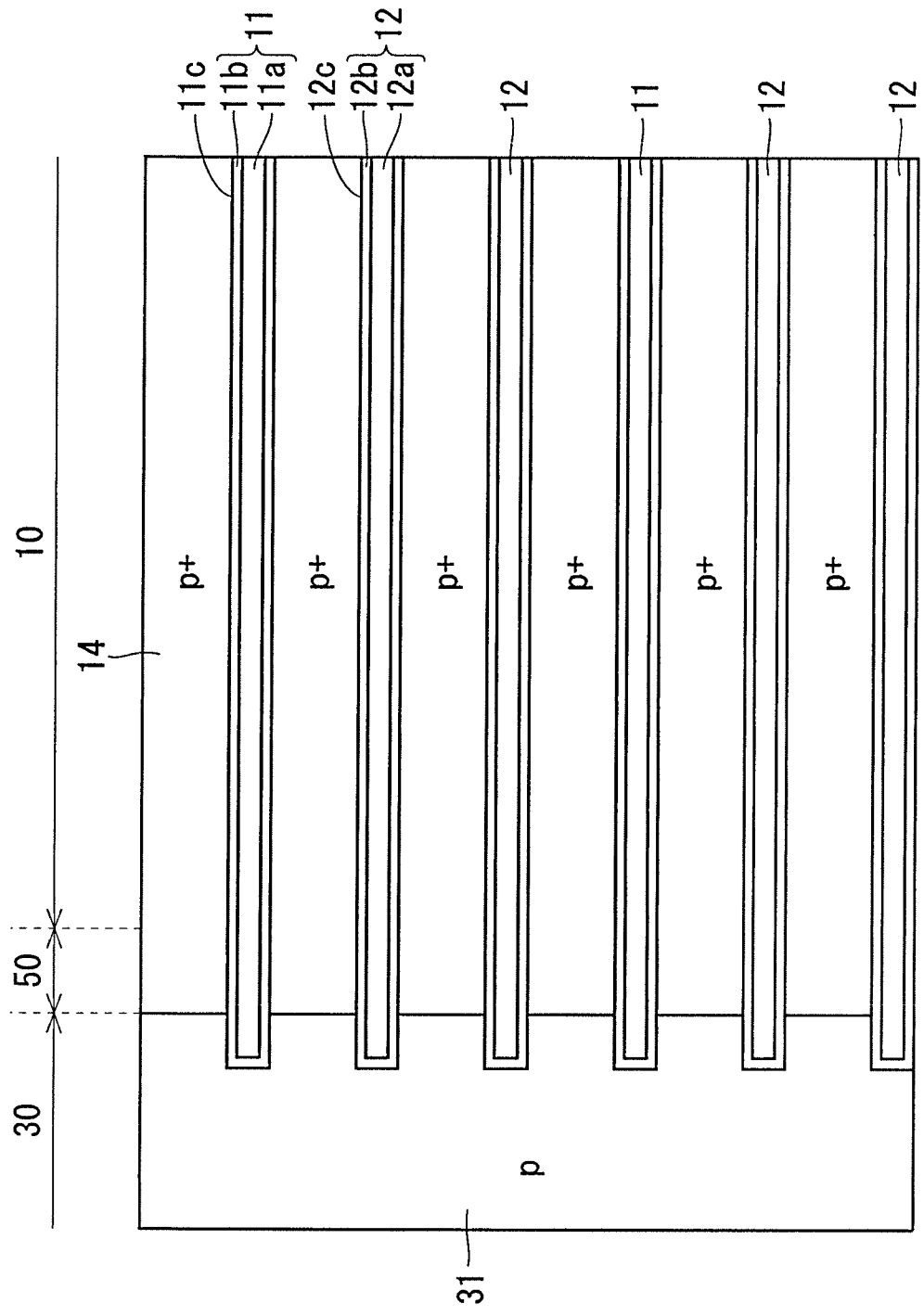
FIG. 19 is a plan view illustrating a manufacturing process of the IGBT of Embodiment 4.
Figure 20:
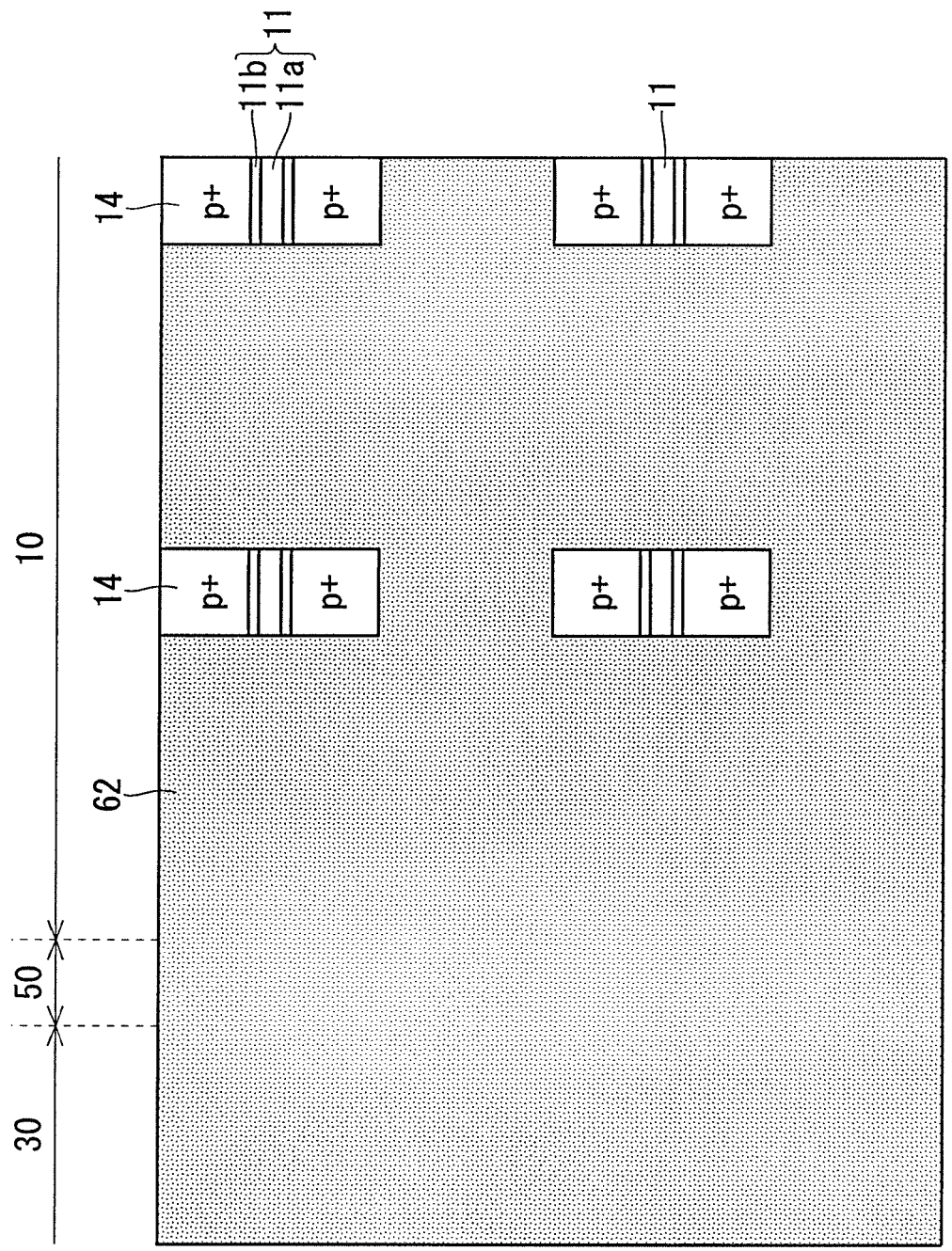
FIG. 20 is a plan view illustrating a manufacturing process of the IGBT of Embodiment 4.

FIG. 17 is a flowchart illustrating a method of manufacturing the IGBT 104 of Embodiment 4. FIGS. 18 to 20 are plan views illustrating states the IGBT 104 is being manufactured. Hereinafter, a method of manufacturing the IGBT 104 will be described with reference to FIGS. 17 to 20.

First, an n-type semiconductor substrate is prepared in Step S201. The semiconductor substrate has the first main surface S1 and the second main surface S2, and corresponds to the semiconductor substrate 8 illustrated in FIG. 16. The semiconductor substrate, at this stage, contains only the drift layer 1 and has not yet contained the carrier storage layer 2, the buffer layer 3, the collector layer 16, the base layer 15, the contact layer 14, and the emitter layer 13.

Next, in Step S202, the p-type first well layer 31a is formed on the first main surface S1 side of the outer peripheral portion of the semiconductor substrate. In plan view, the region where the first well layer 31a of the semiconductor substrate is formed becomes the edge region 30 and the boundary region 50, and the region where the first well layer 31a is not formed becomes the active region 10.

Then, in Step S203, the first mask is formed on the first main surface S1 of the semiconductor substrate. The first mask covers the edge region 30 and has an opening throughout the active region 10 and the boundary region 50.

Next, in Step S204, the n-type impurity ions are implanted into the active region 10 and the boundary region 50 using the first mask to form the carrier storage layer 2 in the active region 10 and the third well layer 31c in the boundary region 50, respectively.

Then, in Step S205, the p-type impurity ions are implanted into the active region 10 and the boundary region 50 using the first mask, and the base layer 15 on the carrier storage layer 2 in the active region 10 and the second well layer 31b on the third well layer 31c in the boundary region 50 are formed, respectively.

Next, in Step S206, the p-type impurity ions are implanted into the active region 10 and the boundary region 50 using the first mask to form the contact layer 14 on the base layer 15 in the active region 10 and on the second well layer 31b in the boundary region 50. In this manner, the planar configuration illustrated in FIG. 18 is obtained.

Next, in Step S207, the active trench gates 11 and the dummy trench gates 12 are formed in the boundary region 50 and the active region 10, and the configuration illustrated in FIG. 19 is obtained.

Then, in Step S208, a second mask 62 is formed as illustrated in FIG. 20. The second mask 62 has a pattern different from that of the first mask, and has an opening in part of the active region 10.

Next, in Step S209, the p-type impurity ions are implanted into a part of the active region 10 using the second mask 62. The dosage of the p-type impurity ions in Step S209 is greater than the dosage of the p-type impurity ions implanted to form the contact layer 14 in Step S206. Therefore, in the contact layer 14, the region into which the n-type impurity ions are implanted changes the conductivity type to the n-type and become the emitter layer 13. In the contact layer 14, the region covered with the second mask 62, where the n-type impurity ions are not implanted in Step S209, remains as the contact layer 14 as it is. In this manner, the planar configuration illustrated in FIG. 15 is obtained.

As described above, after forming the contact layer 14 using the first mask for forming the carrier storage layer 2 and the base layer 15, the part of the contact layer 14 is converted into the emitter layer 13; thereby, ensuring the reduction of masks for forming the emitter layer 13.

Next, in Step S210, the interlayer insulating film 4 is formed, and further, contact holes are formed.

Then, in Step S211, the barrier metal 5 and the emitter electrode 6 are formed. Further, the formation of the configuration on the second main surface S2 side of the semiconductor substrate, that is, the buffer layer 3, the collector layer 16, and the collector electrode 7 are appropriately performed.

The ion implantation was performed in Steps S204 to S106 and S209. The activation annealing for activating the implanted ions may be performed each time after each ion implantation step, or may be performed collectively after the completion of all the ion implantation steps. Further, although in Step S207, the active trench gates 11 and the dummy trench gates 12 are formed, the heat treatment at the time of forming the gate insulating film 11b and the dummy trench insulating film 12b may also serve as the activation annealing for the ions implanted before the heat treatment. In this case, the manufacturing cost can be reduced.

The formation of the first mask and the ion implantation using the first mask described in Steps S203 to S206 may be performed before the formation of the well layer 31 described in Step S202. Further, the formation of the second mask 61 and the ion implantation using the second mask 61 described in Steps S208 and S209 may be performed before the formation of the active trench gates 11 and the dummy trench gates 12 described in Step S207.

Forming the trench gates in Step S207 creates steps on the first main surface S1 of the semiconductor substrate 8. However, according to the above manufacturing method, in Steps S204 to S206 before forming the trench gates, ion implantation is performed on the flat first main surface S1 of the semiconductor substrate 8, and the base layer 15, the carrier storage layer 2, and the contact layer 14 can be formed. Therefore, the variation in the impurity profile caused by the steps on the surface of the semiconductor substrate 8 is suppressed.

<D-3. Effects>

The method of manufacturing the semiconductor device according to Embodiment 4 includes a step (a) of forming the first mask on the first main surface S1 of the semiconductor substrate 8 having the first conductive type drift layer 1, a step (b) of forming the base layer 15 of the second conductivity type on the first main surface S1 side of the drift layer 1 in the active region 10 by implanting the impurity ions of the second conductivity type into the first main surface S1 of the semiconductor substrate 8 using the first mask, a step of (c) of forming the contact layer 14 of the second conductivity type on the first main surface S1 side of the base layer 15 by implanting the impurity ions of the second conductivity type into the first main surface S1 of the semiconductor substrate 8 using the first mask, a step (d) of forming the trenches 11c reaching the drift layer 1 from the first main surface S1 of the semiconductor substrate 8 after the steps (b) and (c), a step (e) of embedding the gate electrode 11a inside the trenches 11c via the gate insulating film 11b, a step (f) of forming the second mask 62 having a different pattern from that of the first mask on the first main surface S1 of the semiconductor substrate 8, and a step (g) of converting a part of the contact layer 14 into the impurity layer of the first conductivity type by implanting the impurity ions of the first conductivity type having the dosage higher than that of the impurity ions of the second conductivity type implanted at the step (c) into the first main surface S1 of the semiconductor substrate 8 using the second mask 62. Consequently, masks for the contact layer can be reduced.

Further, the method of manufacturing the semiconductor device according to Embodiment 4 includes a step (h) of forming the first well layer 31a of the second conductivity type in the semiconductor substrate 8 in the boundary region 50 and the edge region 30, and the step (b) may also be a step of forming the second well layer 13b of the second conductivity type on the first main surface S1 side of the first well layer 31a in the boundary region 50 at the same time as when the base layer 15 is formed. The second well layer 31b has a net impurity concentration higher than that of the first well layer 31a. In this case, forming the second well layer 31b in the boundary region 50 enhances the hole pulling ability at the time of turn-off and ensures improvement of the fracture resistance.

The Embodiments can be combined, appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A method of manufacturing a semiconductor device demarcated into an active region, a boundary region surrounding the active region, and an edge region surrounding the boundary region in plan view, the method comprising:
    a step (a) of forming a first mask on a first main surface of the semiconductor substrate having a drift layer of a first conductivity type;
    a step (b) of forming a base layer of a second conductivity type on a side of the first main surface of at least a part a region of the drift layer in the active region by implanting impurity ions of the second conductivity type into the first main surface of the semiconductor substrate using the first mask;
    a step of (c) of forming an impurity layer of the first conductivity type on the side of the first main surface of the base layer by implanting impurity ions of the first conductivity type into the first main surface of the semiconductor substrate using the first mask;
    a step (d) of forming trenches reaching the drift layer from the first main surface of the semiconductor substrate after the steps (b) and (c);
    a step (e) of embedding a gate electrode inside the trenches via a gate insulating film;
    a step (f) of forming a second mask having a different pattern from that of the first mask on the first main surface of the semiconductor substrate; and
    a step (g) of converting a part of the impurity layer into a first contact layer of the second conductivity type by implanting impurity ions of the second conductivity type having a dosage higher than that of the impurity ions of the first conductivity type implanted at the step (c) into the first main surface of the semiconductor substrate using the second mask.

2. The method of manufacturing the semiconductor device according to claim 1, further comprising
    a step (h) of forming a well layer of the second conductivity type in the semiconductor substrate in the boundary region and the edge region, wherein
    the step (g) is a step of forming a second contact layer of the second conductivity type on the side of the first main surface of the well layer in the boundary region at a same time as when converting a part of the impurity layer into the first contact layer, and
    a net impurity concentration of the second contact layer is higher than a net impurity concentration of the first contact layer.

3. The method of manufacturing the semiconductor device according to claim 1, wherein
    a diffusion coefficient of the impurity ions of the second conductivity type implanted at the step (b) in the semiconductor substrate is greater than a diffusion coefficient of the impurity ions of the first conductivity type implanted at the step (c) in the semiconductor substrate.

4. The method of manufacturing the semiconductor device according to claim 1, wherein
    a width of the boundary region is greater than a depth of the impurity layer.

5. The method of manufacturing the semiconductor device according to claim 1, wherein
    a depth of the first contact layer is greater than a depth of the impurity layer.

6. The method of manufacturing the semiconductor device according to claim 1, wherein
    the step (g) is a step of forming a third contact layer of the second conductivity type in the drift layer in contact with the first main surface of the semiconductor substrate in the active region at a same time as when converting the part of the impurity layer into the first contact layer,
    the third contact layer does not contain impurities of the first conductivity type having a concentration higher than a concentration of impurities of the first conductivity type of the drift layer, and
    a net impurity concentration of the third contact layer is higher than the net impurity concentration of the first contact layer.

7. A method of manufacturing a semiconductor device demarcated into an active region, a boundary region surrounding the active region, and an edge region surrounding the boundary region in plan view, the method comprising:
    a step (a) of forming a first mask on a first main surface of the semiconductor substrate having a drift layer of a first conductivity type;

a step (b) of forming a base layer of a second conductivity type on a side of the first main surface of the drift layer in the active region by implanting impurity ions of the second conductivity type into the first main surface of the semiconductor substrate using the first mask;

a step of (c) of forming a contact layer of the second conductivity type on the side of the first main surface of the base layer by implanting impurity ions of the second conductivity type into the first main surface of the semiconductor substrate using the first mask;

a step (d) of forming trenches reaching the drift layer from the first main surface of the semiconductor substrate after the steps (b) and (c);

a step (e) of embedding a gate electrode inside the trenches via a gate insulating film;

a step (f) of forming a second mask having a different pattern from that of the first mask on the first main surface of the semiconductor substrate; and a step (g) of converting a part of the contact layer into an impurity layer of the first conductivity type by implanting impurity ions of the first conductivity type having a dosage higher than that of the impurity ions of the second conductivity type implanted at the step (c) into the first main surface of the semiconductor substrate using the second mask.

8. The method of manufacturing the semiconductor device according to claim 7, further comprising a step (h) of forming a first well layer of the second conductivity type in the semiconductor substrate in the boundary region and the edge region, wherein the step (b) is a step of forming a second well layer of the second conductivity type on the side of the first main surface of the first well layer in the boundary region at a same time as when forming the base layer, and a net impurity concentration of the second well layer is higher than a net impurity concentration of the first well layer.

\* \* \* \* \*